(12) United States Patent
Tzu et al.

(10) Patent No.: US 6,878,206 B2
(45) Date of Patent: Apr. 12, 2005

(54) LID ASSEMBLY FOR A PROCESSING SYSTEM TO FACILITATE SEQUENTIAL DEPOSITION TECHNIQUES

(75) Inventors: Gwo-Chuan Tzu, Sunnyvale, CA (US); Salvador P. Umotoy, Antioch, CA (US)

(73) Assignee: Applied Materials, Inc., Santa Clara, CA (US)

( * ) Notice: Subject to any disclaimer, the term of this patent is extended or adjusted under 35 U.S.C. 154(b) by 145 days.

(21) Appl. No.: 10/016,300

(22) Filed: Dec. 12, 2001

(65) Prior Publication Data

US 2003/0010451 A1 Jan. 16, 2003

Related U.S. Application Data

(60) Provisional application No. 60/305,970, filed on Jul. 16, 2001.

(51) Int. Cl.$^7$ .............................................. C23C 16/00
(52) U.S. Cl. ................ 118/715; 118/728; 156/345.29; 156/345.33
(58) Field of Search ................. 118/715, 728, 118/50; 156/345.29, 345.33, 345.34, 345.35, 345.36, 345.26, 345.51; 137/262, 263, 264, 454.2, 560, 561 R, 561 A, 571, 572, 573, 574, 575, 576, 590, 594–596, 599.01, 599.05–599.07, 602; 141/285, 286, 37, 44–47, 54, 301–302, 367

(56) References Cited

U.S. PATENT DOCUMENTS

| | | | | |
|---|---|---|---|---|
| 3,592,575 A | * | 7/1971 | Jaeger et al. ................ 431/114 |
| 4,058,430 A | | 11/1977 | Suntola et al. ............... 156/611 |
| 4,389,973 A | | 6/1983 | Suntola et al. ............... 118/725 |
| 4,413,022 A | | 11/1983 | Suntola et al. ........... 427/255.2 |
| 4,486,487 A | | 12/1984 | Skarp .......................... 428/216 |
| 4,761,269 A | * | 8/1988 | Conger et al. ............... 118/679 |
| 4,767,494 A | | 8/1988 | Kobayashi et al. ......... 156/606 |
| 4,806,321 A | | 2/1989 | Nishizawa et al. .......... 422/245 |
| 4,813,846 A | | 3/1989 | Helms ....................... 414/744.1 |
| 4,829,022 A | | 5/1989 | Kobayashi et al. ......... 437/107 |
| 4,834,831 A | | 5/1989 | Nishizawa et al. .......... 156/611 |
| 4,838,983 A | | 6/1989 | Schumaker et al. ........ 156/613 |
| 4,838,993 A | | 6/1989 | Aoki et al. .................. 156/643 |
| 4,840,921 A | | 6/1989 | Matsumoto ................... 437/89 |
| 4,845,049 A | | 7/1989 | Sunakawa ..................... 437/81 |
| 4,859,625 A | | 8/1989 | Nishizawa et al. ........... 437/81 |
| 4,859,627 A | | 8/1989 | Sunakawa ..................... 437/81 |
| 4,861,417 A | | 8/1989 | Mochizuki et al. .......... 156/610 |
| 4,876,218 A | | 10/1989 | Pessa et al. .................. 437/107 |
| 4,917,556 A | | 4/1990 | Stark et al. .................. 414/217 |
| 4,927,670 A | | 5/1990 | Erbil ......................... 427/255.3 |
| 4,931,132 A | | 6/1990 | Aspnes et al. ............... 156/601 |

(Continued)

FOREIGN PATENT DOCUMENTS

| | | | |
|---|---|---|---|
| DE | 196 27 017 A1 | 1/1997 | ......... H01L/21/283 |
| DE | 198 20 147 A1 | 7/1999 | ....... H01L/21/3205 |
| EP | 0 344 352 A1 | 6/1988 | ............ H01J/39/24 |

(Continued)

OTHER PUBLICATIONS

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

(Continued)

*Primary Examiner*—Rudy Zervigon
(74) *Attorney, Agent, or Firm*—Moser Patterson Sheridan

(57) ABSTRACT

A lid assembly for a semiconductor processing system is provided. The lid assembly generally includes a lid having a gas manifold mounted on a first side and a baffle plate mounted on a second side. The gas manifold is configured to deliver a plurality of gases to a plenum defined between the baffle plate and the lid. The gases are mixed within a recess formed in the baffle plate before exiting into the processing system through a singular passage.

23 Claims, 8 Drawing Sheets

U.S. PATENT DOCUMENTS

| | | | |
|---|---|---|---|
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |
| 4,993,357 A | 2/1991 | Scholz | 118/715 |
| 4,993,358 A * | 2/1991 | Mahawili | 118/715 |
| 5,000,113 A | 3/1991 | Wang et al. | 118/723 |
| 5,013,683 A | 5/1991 | Petroff et al. | 437/110 |
| 5,028,565 A | 7/1991 | Chang et al. | 437/192 |
| 5,082,798 A | 1/1992 | Arimoto | 437/108 |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | 437/111 |
| 5,166,092 A | 11/1992 | Mochizuki et al. | 437/105 |
| 5,173,474 A | 12/1992 | Connell et al. | 505/1 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | 437/108 |
| 5,232,164 A * | 8/1993 | Resch et al. | 239/434 |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | 156/611 |
| 5,254,207 A | 10/1993 | Nishizawa et al. | 156/601 |
| 5,256,244 A | 10/1993 | Ackerman | 156/613 |
| 5,259,881 A | 11/1993 | Edwards et al. | 118/719 |
| 5,261,959 A | 11/1993 | Gasworth | 118/719 |
| 5,270,247 A | 12/1993 | Sakuma et al. | 437/133 |
| 5,278,435 A | 1/1994 | Van Hove et al. | 257/184 |
| 5,281,274 A | 1/1994 | Yoder | 118/697 |
| 5,286,296 A | 2/1994 | Sato et al. | 118/719 |
| 5,290,748 A | 3/1994 | Knuuttila et al. | 502/228 |
| 5,294,286 A | 3/1994 | Nishizawa et al. | 156/610 |
| 5,296,403 A | 3/1994 | Nishizawa et al. | 437/133 |
| 5,300,186 A | 4/1994 | Kitahara et al. | 156/613 |
| 5,311,055 A | 5/1994 | Goodman et al. | 257/593 |
| 5,316,615 A | 5/1994 | Copel | 117/95 |
| 5,316,793 A | 5/1994 | Wallace et al. | 427/248.1 |
| 5,330,610 A | 7/1994 | Eres et al. | 117/86 |
| 5,336,324 A | 8/1994 | Stall et al. | 118/719 |
| 5,338,362 A | 8/1994 | Imahashi | 118/719 |
| 5,338,389 A | 8/1994 | Nishizawa et al. | 117/89 |
| 5,348,911 A | 9/1994 | Jurgensen et al. | 117/91 |
| 5,374,570 A | 12/1994 | Nasu et al. | 437/40 |
| 5,395,791 A | 3/1995 | Cheng et al. | 437/105 |
| 5,423,936 A * | 6/1995 | Tomita et al. | 156/345.43 |
| 5,438,952 A | 8/1995 | Otsuka | 117/84 |
| 5,439,876 A | 8/1995 | Graf et al. | 505/447 |
| 5,441,703 A | 8/1995 | Jurgensen | 422/129 |
| 5,443,033 A | 8/1995 | Nishizawa et al. | 117/86 |
| 5,443,647 A | 8/1995 | Aucoin et al. | 118/723 ME |
| 5,455,072 A | 10/1995 | Bension et al. | 427/255.7 |
| 5,458,084 A | 10/1995 | Thorne et al. | 117/89 |
| 5,469,806 A | 11/1995 | Mochizuki et al. | 117/97 |
| 5,480,818 A | 1/1996 | Matsumoto et al. | 437/40 |
| 5,483,919 A | 1/1996 | Yokoyama et al. | 117/89 |
| 5,484,664 A | 1/1996 | Kitahara et al. | 428/641 |
| 5,500,256 A * | 3/1996 | Watabe | 427/579 |
| 5,503,875 A | 4/1996 | Imai et al. | 427/255.3 |
| 5,521,126 A | 5/1996 | Okamura et al. | 437/235 |
| 5,527,733 A | 6/1996 | Nishizawa et al. | 437/160 |
| 5,532,511 A | 7/1996 | Nishizawa et al. | 257/627 |
| 5,540,783 A | 7/1996 | Eres et al. | 118/725 |
| 5,580,380 A | 12/1996 | Liu et al. | 117/86 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,637,530 A | 6/1997 | Gaines et al. | 114/105 |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,693,139 A | 12/1997 | Nishizawa et al. | 117/89 |
| 5,695,564 A | 12/1997 | Imahashi | 118/719 |
| 5,705,224 A | 1/1998 | Murota et al. | 427/248.1 |
| 5,707,880 A | 1/1998 | Aftergut et al. | 437/3 |
| 5,711,811 A | 1/1998 | Suntola et al. | 118/711 |
| 5,730,801 A | 3/1998 | Tepman et al. | 118/719 |
| 5,730,802 A | 3/1998 | Ishizumi et al. | 118/719 |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,851,849 A | 12/1998 | Comizzoli et al. | 438/38 |
| 5,855,675 A | 1/1999 | Doering et al. | 118/719 |
| 5,855,680 A | 1/1999 | Soininen et al. | 118/719 |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | 73/1.36 |
| 5,879,459 A | 3/1999 | Gadgil et al. | 118/715 |
| 5,882,165 A | 3/1999 | Maydan et al. | 414/217 |
| 5,882,413 A | 3/1999 | Beaulieu et al. | 118/719 |
| 5,904,565 A | 5/1999 | Nguyen et al. | 438/687 |
| 5,916,365 A | 6/1999 | Sherman | 117/92 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,947,710 A | 9/1999 | Cooper et al. | 418/63 |
| 5,972,430 A | 10/1999 | DiMeo, Jr. et al. | 427/255.32 |
| 5,976,261 A * | 11/1999 | Moslehi et al. | 118/719 |
| 6,001,669 A | 12/1999 | Gaines et al. | 438/102 |
| 6,015,590 A | 1/2000 | Suntola et al. | 427/255.23 |
| 6,025,627 A | 2/2000 | Forbes et al. | 257/321 |
| 6,036,773 A | 3/2000 | Wang et al. | 117/97 |
| 6,042,652 A | 3/2000 | Hyun et al. | 118/719 |
| 6,043,177 A | 3/2000 | Falconer et al. | 502/4 |
| 6,051,286 A | 4/2000 | Zhao et al. | 427/576 |
| 6,062,798 A | 5/2000 | Muka | 414/416 |
| 6,071,808 A | 6/2000 | Merchant et al. | 438/633 |
| 6,084,302 A | 7/2000 | Sandhu | 257/751 |
| 6,086,677 A | 7/2000 | Umotoy et al. | 118/715 |
| 6,110,556 A | 8/2000 | Bang et al. | 428/64.1 |
| 6,113,977 A | 9/2000 | Soininen et al. | 427/64 |
| 6,117,244 A | 9/2000 | Bang et al. | 118/715 |
| 6,123,775 A * | 9/2000 | Hao et al. | 118/724 |
| 6,124,158 A | 9/2000 | Dautartas et al. | 438/216 |
| 6,130,147 A | 10/2000 | Major et al. | 438/604 |
| 6,139,700 A | 10/2000 | Kang et al. | 204/192.17 |
| 6,140,237 A | 10/2000 | Chan et al. | 438/687 |
| 6,140,238 A | 10/2000 | Kitch | 438/687 |
| 6,143,659 A | 11/2000 | Leem | 438/688 |
| 6,144,060 A | 11/2000 | Park et al. | 257/310 |
| 6,158,446 A | 12/2000 | Mohindra et al. | 134/25.4 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,206,967 B1 | 3/2001 | Mak et al. | 118/666 |
| 6,207,302 B1 | 3/2001 | Sugiura et al. | 428/690 |
| 6,231,672 B1 | 5/2001 | Choi et al. | 118/715 |
| 6,248,605 B1 | 6/2001 | Harkonen et al. | 438/29 |
| 6,270,572 B1 | 8/2001 | Kim et al. | 117/93 |
| 6,271,148 B1 | 8/2001 | Kao et al. | 438/727 |

| | | | |
|---|---|---|---|
| 6,287,965 B1 | 9/2001 | Kang et al. ............... 438/648 |
| 6,291,876 B1 | 9/2001 | Stumborg et al. ........... 257/632 |
| 6,305,314 B1 | 10/2001 | Sneh et al. ............. 118/723 R |
| 6,306,216 B1 | 10/2001 | Kim et al. .................. 118/725 |
| 6,316,098 B1 | 11/2001 | Yitzchaik et al. ........... 428/339 |
| 6,447,607 B2 | 9/2002 | Soininen et al. ............ 117/200 |
| 6,478,872 B1 | 11/2002 | Chae et al. .................. 117/88 |
| 6,481,945 B1 | 11/2002 | Hasper et al. ............. 414/217 |
| 6,511,539 B1 | 1/2003 | Raaijmakers ............... 117/102 |
| 6,551,406 B2 | 4/2003 | Kilpi ......................... 118/728 |
| 6,572,705 B1 | 6/2003 | Suntola et al. ............. 118/702 |
| 6,578,287 B2 | 6/2003 | Aswad ....................... 34/367 |
| 6,579,372 B2 | 6/2003 | Park .......................... 118/715 |
| 6,630,030 B1 | 10/2003 | Suntola et al. ............. 118/728 |
| 6,630,201 B2 | 10/2003 | Chiang et al. ......... 427/255.28 |
| 6,660,126 B2 | 12/2003 | Nguyen et al. ........ 156/345.34 |
| 2001/0000866 A1 | 5/2001 | Sneh et al. ............ 118/732 R |
| 2001/0009140 A1 | 7/2001 | Bondestam et al. ........ 118/725 |
| 2001/0011526 A1 | 8/2001 | Doering et al. ............. 118/729 |
| 2001/0013312 A1 | 8/2001 | Soininen et al. ............. 117/86 |
| 2001/0014371 A1 | 8/2001 | Kilpi ..................... 427/255.28 |
| 2001/0031562 A1 | 10/2001 | Raaijmakers et al. ....... 438/770 |
| 2001/0034123 A1 | 10/2001 | Jeon et al. .................. 438/643 |
| 2001/0041250 A1 | 11/2001 | Werkhoven et al. ........ 428/212 |
| 2001/0042523 A1 | 11/2001 | Kesala ....................... 122/6.6 |
| 2001/0042799 A1 | 11/2001 | Kim et al. .................. 239/553 |
| 2001/0054377 A1 | 12/2001 | Lindfors et al. ............ 117/104 |
| 2002/0000196 A1 | 1/2002 | Park .......................... 118/715 |
| 2002/0007790 A1 | 1/2002 | Park .......................... 118/715 |
| 2002/0041931 A1 | 4/2002 | Suntola et al. ......... 427/255.28 |
| 2002/0052097 A1 | 5/2002 | Park .......................... 438/507 |
| 2002/0066411 A1 | 6/2002 | Chiang et al. .............. 118/724 |
| 2002/0073924 A1 | 6/2002 | Chiang et al. .......... 118/723 R |
| 2002/0076481 A1 | 6/2002 | Chiang et al. ................. 427/8 |
| 2002/0076507 A1 | 6/2002 | Chiang et al. .............. 427/569 |
| 2002/0076508 A1 | 6/2002 | Chiang et al. .............. 427/569 |
| 2002/0086106 A1 | 7/2002 | Park et al. ............... 427/248.1 |
| 2002/0092471 A1 | 7/2002 | Kang et al. ................. 118/715 |
| 2002/0094689 A1 | 7/2002 | Park .......................... 438/694 |
| 2002/0104481 A1 | 8/2002 | Chiang et al. ........... 118/723 I |
| 2002/0108570 A1 | 8/2002 | Lindfors .................... 118/715 |
| 2002/0121241 A1 | 9/2002 | Nguyen et al. ............. 118/715 |
| 2002/0121342 A1 | 9/2002 | Nguyen et al. ........ 156/345.33 |
| 2002/0127745 A1 | 9/2002 | Lu et al. ...................... 438/14 |
| 2002/0134307 A1 | 9/2002 | Choi .......................... 118/715 |
| 2002/0144655 A1 | 10/2002 | Chiang et al. .............. 118/715 |
| 2002/0144657 A1 | 10/2002 | Chiang et al. .......... 118/723 E |
| 2002/0146511 A1 | 10/2002 | Chiang et al. ........... 427/248.1 |
| 2003/0004723 A1 | 1/2003 | Chihara ..................... 704/260 |
| 2003/0010451 A1 | 1/2003 | Tzu et al. ............... 156/345.33 |
| 2003/0022338 A1 | 1/2003 | Chin et al. .................. 435/194 |
| 2003/0042630 A1 | 3/2003 | Babcoke et al. .......... 261/121.1 |
| 2003/0053799 A1 | 3/2003 | Lei ............................ 392/388 |
| 2003/0072913 A1 | 4/2003 | Chou et al. ................. 428/114 |
| 2003/0075273 A1 | 4/2003 | Kilpela et al. .......... 156/345.33 |
| 2003/0075925 A1 | 4/2003 | Lindfors et al. ............ 285/367 |
| 2003/0079686 A1 | 5/2003 | Chen et al. ................. 118/715 |
| 2003/0089308 A1 | 5/2003 | Raaijmakers ............... 117/200 |
| 2003/0101927 A1 | 6/2003 | Raaijmakers ............... 117/200 |
| 2003/0106490 A1 | 6/2003 | Jallepally et al. ............. 117/80 |
| 2003/0113187 A1 | 6/2003 | Lei et al. .................... 414/217 |
| 2003/0116087 A1 | 6/2003 | Nguyen et al. ............. 118/715 |
| 2003/0121469 A1 | 7/2003 | Lindfors et al. ............ 117/105 |
| 2003/0121608 A1 | 7/2003 | Chen et al. ............ 156/345.33 |
| 2003/0140854 A1 | 7/2003 | Kilpi .......................... 118/715 |
| 2003/0143328 A1 | 7/2003 | Chen et al. ............ 427/255.28 |
| 2003/0143747 A1 | 7/2003 | Bondestam et al. .......... 436/34 |
| 2003/0153177 A1 | 8/2003 | Tepman et al. ............. 438/656 |
| 2003/0172872 A1 | 9/2003 | Thakur et al. .............. 118/715 |
| 2003/0194493 A1 | 10/2003 | Chang et al. ............ 427/248.1 |
| 2003/0198754 A1 | 10/2003 | Xi et al. ..................... 427/576 |
| 2003/0213560 A1 | 11/2003 | Wang et al. ........... 156/345.31 |
| 2003/0216981 A1 | 11/2003 | Tillman ....................... 705/34 |
| 2003/0221780 A1 | 12/2003 | Lei et al. ............... 156/345.29 |
| 2003/0224107 A1 | 12/2003 | Lindfors et al. ........ 427/255.28 |
| 2004/0011404 A1 | 1/2004 | Ku et al. .................... 137/341 |
| 2004/0011504 A1 | 1/2004 | Ku et al. ...................... 165/47 |
| 2004/0013577 A1 | 1/2004 | Ganguli et al. ............. 422/129 |
| 2004/0014320 A1 | 1/2004 | Chen et al. ................. 438/692 |
| 2004/0015300 A1 | 1/2004 | Ganguli et al. ............... 702/24 |

FOREIGN PATENT DOCUMENTS

| | | | |
|---|---|---|---|
| EP | 0 442 290 A1 | 2/1991 | ........... C30B/25/02 |
| EP | 0 429 270 A2 | 5/1991 | ............ G03F/7/36 |
| EP | 0 799 641 A2 | 10/1997 | ............ B01J/20/32 |
| EP | 1167569 | 1/2002 | ........ C23C/16/455 |
| FR | 2.626.110 | 7/1989 | ........... H01L/39/24 |
| FR | 2.692.597 | 12/1993 | ........... C23C/16/00 |
| GB | 2 355 727 A | 5/2001 | ........... C23C/16/44 |
| JP | 58-098917 | 6/1983 | ........ H01L/21/205 |
| JP | 58-100419 | 6/1983 | .......... H01L/21/20 |
| JP | 60-065712 A | 4/1985 | ......... C01B/33/113 |
| JP | 61-035847 | 2/1986 | ............ B01J/19/08 |
| JP | 61-210623 | 9/1986 | ........ H01L/21/205 |
| JP | 62-069508 | 3/1987 | ........ H01L/21/203 |
| JP | 62-091495 | 4/1987 | ........... C30B/25/02 |
| JP | 62-141717 | 6/1987 | ........ H01L/21/203 |
| JP | 62-167297 | 7/1987 | ........... C30B/29/40 |
| JP | 62-171999 | 7/1987 | ........... C30B/29/40 |
| JP | 62-232919 | 10/1987 | ........ H01L/21/205 |
| JP | 63-062313 | 3/1988 | ........ H01L/21/205 |
| JP | 63-085098 | 4/1988 | ........... C30B/21/40 |
| JP | 63-090833 | 4/1988 | ........ H01L/21/365 |
| JP | 63-222420 | 9/1988 | ........ H01L/21/205 |
| JP | 63-222421 | 9/1988 | ........ H01L/21/205 |
| JP | 63-227007 | 9/1988 | ........ H01L/21/205 |
| JP | 63-252420 | 10/1988 | ........ H01L/21/205 |
| JP | 63-266814 | 11/1988 | ........ H01L/21/205 |
| JP | 64-009895 | 1/1989 | ........... C30B/29/40 |
| JP | 64-009896 | 1/1989 | ........... C30B/29/40 |
| JP | 64-009897 | 1/1989 | ........... C30B/29/40 |
| JP | 64-037832 | 2/1989 | ........ H01L/21/205 |
| JP | 64-082615 | 3/1989 | ........ H01L/21/205 |
| JP | 64-082617 | 3/1989 | ........ H01L/21/205 |
| JP | 64-082671 | 3/1989 | ........... H01L/29/78 |
| JP | 64-082676 | 3/1989 | ........... H01L/29/80 |
| JP | 01-103982 | 4/1989 | ........... C30B/23/08 |
| JP | 01-103996 | 4/1989 | ........... C30B/29/40 |
| JP | 64-090524 | 4/1989 | ........ H01L/21/205 |
| JP | 01-117017 | 5/1989 | ........ H01L/21/203 |
| JP | 01-143221 | 6/1989 | ........ H01L/21/314 |
| JP | 01-143233 | 6/1989 | .......... H01L/21/76 |
| JP | 01-154511 | 6/1989 | .......... H01L/21/20 |
| JP | 01-236657 | 9/1989 | ........... H01L/29/80 |
| JP | 01-245512 | 9/1989 | ........ H01L/21/205 |
| JP | 01-264218 | 10/1989 | ........ H01L/21/205 |
| JP | 01-270593 | 10/1989 | ........... C30B/25/02 |
| JP | 01-272108 | 10/1989 | ........ H01L/21/203 |
| JP | 01-290221 | 11/1989 | ........ H01L/21/205 |
| JP | 01-290222 | 11/1989 | ........ H01L/21/205 |
| JP | 01-296673 | 11/1989 | ........... H01L/29/88 |
| JP | 01-303770 | 12/1989 | ........... H01L/39/24 |
| JP | 01-305894 | 12/1989 | ........... C30B/23/08 |
| JP | 01-313927 | 12/1989 | ........ H01L/21/205 |
| JP | 02-012814 | 1/1990 | ........ H01L/21/205 |
| JP | 02-014513 | 1/1990 | ........ H01L/21/205 |
| JP | 02-017634 | 1/1990 | ........ H01L/21/225 |
| JP | 02-063115 | 3/1990 | .......... H01L/21/20 |
| JP | 02-074029 | 3/1990 | ........ H01L/21/205 |
| JP | 02-074587 | 3/1990 | ........... C30B/23/08 |
| JP | 02-106822 | 4/1990 | ........... H01B/13/00 |
| JP | 02-129913 | 5/1990 | ........ H01L/21/205 |

| | | | | | | | |
|---|---|---|---|---|---|---|---|
| JP | 02-162717 | 6/1990 | H01L/21/20 | JP | 07-086269 | 3/1995 | H01L/21/314 |
| JP | 02-172895 | 7/1990 | C30B/29/36 | JP | 08-181076 | 7/1996 | H01L/21/205 |
| JP | 02-196092 | 8/1990 | C30B/25/14 | JP | 08-245291 | 9/1996 | C30B/25/14 |
| JP | 02-203517 | 8/1990 | H01L/21/205 | JP | 08-264530 | 10/1996 | H01L/21/3205 |
| JP | 02-230690 | 9/1990 | H05B/33/10 | JP | 09-260786 | 10/1997 | H01S/3/18 |
| JP | 02-230722 | 9/1990 | H01L/21/205 | JP | 09-293681 | 11/1997 | H01L/21/205 |
| JP | 02-246161 | 10/1990 | H01L/29/784 | JP | 10-188840 | 7/1998 | H01J/29/18 |
| JP | 02-264491 | 10/1990 | H01S/3/18 | JP | 10-190128 | 7/1998 | H01S/3/18 |
| JP | 02-283084 | 11/1990 | H01S/3/18 | JP | 10-308283 | 11/1998 | H05B/33/22 |
| JP | 02-304916 | 12/1990 | H01L/21/205 | JP | 11-269652 | 10/1999 | C23C/16/44 |
| JP | 03-019211 | 1/1991 | H01L/21/205 | JP | 2000-031387 | 1/2000 | H01L/27/04 |
| JP | 03-022569 | 1/1991 | H01L/29/804 | JP | 2000-058777 | 2/2000 | H01L/27/108 |
| JP | 03-023294 | 1/1991 | C30B/25/18 | JP | 2000-068072 | 3/2000 | H05B/33/22 |
| JP | 03-023299 | 1/1991 | C30B/29/40 | JP | 2000-087029 | 3/2000 | C09K/11/08 |
| JP | 03-044967 | 2/1991 | H01L/29/48 | JP | 2000-319772 | 3/2000 | C23C/16/00 |
| JP | 03-048421 | 3/1991 | H01L/21/302 | JP | 2000-138094 | 5/2000 | H05B/33/10 |
| JP | 03-070124 | 3/1991 | H01L/21/205 | JP | 2000212752 | 8/2000 | |
| JP | 03-185716 | 8/1991 | H01L/21/205 | JP | 2000-218445 | 8/2000 | B23P/6/00 |
| JP | 03-208885 | 9/1991 | C30B/23/02 | JP | 2000-319772 | 11/2000 | C23C/14/24 |
| JP | 03-234025 | 10/1991 | H01L/21/318 | JP | 2000-340883 | 12/2000 | H01S/5/125 |
| JP | 03-286522 | 12/1991 | H01L/21/205 | JP | 2000-353666 | 12/2000 | H01L/21/205 |
| JP | 03-286531 | 12/1991 | H01L/21/316 | JP | 2001-020075 | 1/2001 | C23C/16/44 |
| JP | 04-031391 | 2/1992 | C30B/23/08 | JP | 2001-62244 | 3/2001 | B01D/53/34 |
| JP | 04-031396 | 2/1992 | C30B/25/14 | JP | 2001-152339 | 6/2001 | C23C/16/40 |
| JP | 04-100292 | 4/1992 | H01S/3/18 | JP | 2001-172767 | 6/2001 | C23C/16/40 |
| JP | 04-111418 | 4/1992 | H01L/21/205 | JP | 2001-189312 | 7/2001 | H01L/21/316 |
| JP | 04-132214 | 5/1992 | H01L/21/205 | JP | 2001-217206 | 8/2001 | H01L/21/285 |
| JP | 04-132681 | 5/1992 | C30B/25/14 | JP | 2001-220287 | 8/2001 | C30B/25/02 |
| JP | 04/151822 | 5/1992 | H01L/21/205 | JP | 2001-220294 | 8/2001 | C30B/29/20 |
| JP | 04-162418 | 6/1992 | H01L/21/205 | JP | 2001-240972 | 9/2001 | C23C/16/458 |
| JP | 04-175299 | 6/1992 | C30B/29/68 | JP | 2001-254181 | 9/2001 | C23C/16/46 |
| JP | 04-186824 | 7/1992 | H01L/21/205 | JP | 2001-284042 | 10/2001 | H05B/33/04 |
| JP | 04-212411 | 8/1992 | H01L/21/203 | JP | 2001-303251 | 10/2001 | C23C/16/44 |
| JP | 04-260696 | 9/1992 | C30B/29/40 | JP | 2001-328900 | 11/2001 | C30B/29/68 |
| JP | 04-273120 | 9/1992 | H01L/21/20 | WO | 90/02216 | 3/1990 | C23C/14/34 |
| JP | 04-285167 | 10/1992 | C23C/14/54 | WO | 91/10510 | 7/1991 | B01J/37/02 |
| JP | 04-291916 | 10/1992 | H01L/21/205 | WO | 93/0211 | 2/1993 | C08F/4/78 |
| JP | 04-325500 | 11/1992 | C30B/33/00 | WO | WO 96/17107 | 6/1996 | |
| JP | 04-328874 | 11/1992 | H01L/29/804 | WO | 96/17107 | 6/1996 | C23C/16/44 |
| JP | 05-029228 | 2/1993 | H01L/21/205 | WO | 96/18756 | 6/1996 | C23C/16/08 |
| JP | 05-047665 | 2/1993 | H01L/21/205 | WO | 98/06889 | 2/1998 | |
| JP | 05-047666 | 2/1993 | H01L/21/205 | WO | 98/51838 | 11/1998 | C23C/16/06 |
| JP | 05-047668 | 2/1993 | H01L/21/205 | WO | 99/01595 | 1/1999 | C30B/25/14 |
| JP | 05-074717 | 3/1993 | H01L/21/205 | WO | 99/13504 | 3/1999 | H01L/21/68 |
| JP | 05-074724 | 3/1993 | H01L/21/205 | WO | 99/29924 | 6/1999 | C23C/16/04 |
| JP | 05-102189 | 4/1993 | H01L/21/336 | WO | 99/41423 | 8/1999 | |
| JP | 05-160152 | 6/1993 | H01L/21/336 | WO | 99/65064 | 12/1999 | H01L/21/00 |
| JP | 05-175143 | 7/1993 | H01L/21/205 | WO | 00/11721 | 3/2000 | H01L/29/43 |
| JP | 05-175145 | 7/1993 | H01L/21/205 | WO | 00/15865 | 3/2000 | C23C/16/00 |
| JP | 05-182906 | 7/1993 | H01L/21/20 | WO | 00/15881 A2 | 3/2000 | |
| JP | 05-186295 | 7/1993 | C30B/25/02 | WO | 00/16377 A2 | 3/2000 | |
| JP | 05-206036 | 8/1993 | H01L/21/205 | WO | 00/54320 A1 | 9/2000 | H01L/21/44 |
| JP | 05-234899 | 9/1993 | H01L/21/205 | WO | 00/63957 A1 | 10/2000 | H01L/21/205 |
| JP | 05-235047 | 9/1993 | H01L/21/338 | WO | 00/79019 A1 | 12/2000 | C23C/16/00 |
| JP | 05-251339 | 9/1993 | H01L/21/20 | WO | 00/79576 | 12/2000 | H01L/21/205 |
| JP | 05-270997 | 10/1993 | C30B/29/68 | WO | 00/79576 A1 | 12/2000 | H01L/21/205 |
| JP | 05-283336 | 10/1993 | H01L/21/20 | WO | 01/15220 | 3/2001 | H01L/21/768 |
| JP | 05-291152 | 11/1993 | H01L/21/205 | WO | 01/15220 A1 | 3/2001 | H01L/21/768 |
| JP | 05-304334 | 11/1993 | H01L/3/18 | WO | 01/17692 | 3/2001 | B05C/11/00 |
| JP | 05-343327 | 12/1993 | H01L/21/205 | WO | 01/27346 A1 | 4/2001 | C23C/16/44 |
| JP | 05-343685 | 12/1993 | H01L/29/784 | WO | 01/27347 A1 | 4/2001 | C23C/16/44 |
| JP | 06-045606 | 2/1994 | H01L/29/784 | WO | 01/29280 A1 | 4/2001 | H01L/21/00 |
| JP | 06-132236 | 5/1994 | H01L/21/205 | WO | 01/29891 A1 | 4/2001 | H01L/21/768 |
| JP | 06-177381 | 6/1994 | H01L/29/784 | WO | 01/29893 A1 | 4/2001 | H01L/21/768 |
| JP | 06-196809 | 7/1994 | H01S/3/18 | WO | 01/36702 A1 | 5/2001 | C23C/16/00 |
| JP | 06-222388 | 8/1994 | G02F/1/136 | WO | 01/36702 | 5/2001 | C23C/16/00 |
| JP | 06-224138 | 8/1994 | H01L/21/205 | WO | 01/40541 A1 | 6/2001 | C23C/16/40 |
| JP | 06-230421 | 8/1994 | G02F/1/136 | WO | 01/66832 A2 | 9/2001 | C23C/16/44 |
| JP | 06-252057 | 9/1994 | H01L/21/205 | WO | 02/08488 | 1/2002 | C23C/16/44 |
| JP | 06-291048 | 10/1994 | H01L/21/205 | WO | WO 02/45871 A1 | 6/2002 | |
| JP | 07-070752 | 3/1995 | C23C/16/40 | | | | |

OTHER PUBLICATIONS

Scheper, et al., "Low-temperature deposition of titanium nitride films from dialkylhydrazine-based precursors", Materials Science in Semiconductor Processing 2 (1999), pp. 149–157.

Suzuki, et al., "A 0.2-$\mu$m contact filing by 450° C–hydrazine-reduced TiN film with low resistivity", IEDM 92–979, pp. 11.8.1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some $\beta$–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

"Cluster Tools for Fabrication of Advanced devices" Jap. J. of Applied Physics, Extended Abstracts, 22nd Conference Solid State Devices and Materials (1990), pp. 849–852 XP000178141 (article on order—to be provided).

"Applications of Integrated processing", Solid State Technology, US, Cowan Pub., vol. 37, No. 12 (Dec. 1, 1994), pp. 45–47.

Kitigawa, et al., "Hydrogen–mediated low temperature epitaxy of Si in plasma–enhanced chemical vapor deposition", Applied Surface Science (2000), pp. 30–34 (article on order—to be provided).

Lee, et al., "Pulsed nucleation for ultra–high aspect ratio tungsten plugfill", Novellus Systems, Inc. (2001), pp. 1–2 (Article on Order—To be Provided).

Hultman, et al., "Review of the thermal and mechanical stability of TiN–based thin films", Zeitschrift Fur Metallkunde, 90(10)(Oct. 1999), pp. 803–813.

Klaus, et al., "Atomic Layer Deposition of $SiO_2$ Using Catalyzed and Uncatalyzed Self–Limiting Surface Reactions", Surface Review & Letters, 6(3&4)(1999), pp. 435–448.

Yamaguchi, et al., "Atomic–layer chemical–vapor–deposition of silicon dioxide films with extremely low hydrogen content", Appl. Surf. Sci., vol. 130–132 (1998), pp. 202–207.

George, et al., "Surface Chemistry for Atomic Layer Growth", J. Phys. Chem., vol. 100 (1996), pp. 13121–13131.

George, et al., "Atomic layer controlled deposition of $SiO_2$ and $Al_2O_3$ using ABAB . . . binary reaction sequence chemistry", Appl. Surf. Sci., vol. 82/83 (1994), pp. 460–467.

Wise, et al., "Diethyldiethoxysilane as a new precursor for $SiO_2$ growth on silicon", Mat. Res. Soc. Symp. Proc., vol. 334 (1994), pp. 37–43.

Niinisto, et al., "Synthesis of oxide thin films and overlayers by atomic layer epitaxy for advanced applications", Mat. Sci & Eng., vol. B41 (1996), pp. 23–29.

Ritala, et al.,"Perfectly conformal TiN and $Al_2O_3$ films deposited by atomic layer deposition", Chemical Vapor Deposition, vol. 5(1) (Jan. 1999), pp. 7–9.

Klaus, et al., "Atomically controlled growth of tungsten and tungsten nitride using sequential surface reactions". Appl. Surf. Sci., vol. 162–163 (Jul. 1999), pp. 479–491.

Klaus, et al., "Atomically controlled growth of tungsten and tungsten nitride using sequential surface reactions", Fifth Int'l Symp. On Atomically Controlled Surfaces, Interfaces and Nanostructures (Jul. 6–9, 1999), Aix en Provence, France.

Min, et al., "Atomic layer deposition of TiN thin films by sequential introduction of Ti precursor and NH/sub3/", Symp.: Advanced Interconnects and Contact Materials and Processes for Future Integrated Circuits (Apr. 13–16, 1998), pp. 337–342.

Min, et al., "Metal–Organic Atomic–Layer Deposition of Titanium–Silicon–Nitride Films", Applied Physics Letters, American Inst. Of Physics, vol. 75(11) (Sep. 13, 1999).

Maertensson, et al., "Atomic Layer Epitaxy of Copper on Tantalum", Chemical Vapor Deposition, 3(1) (Feb. 1, 1997), pp. 45–50.

Ritala, et al., "Atomic Layer Epitaxy Growth of TiN Thin Films", J. Electrochem. Soc., 142(8) (Aug. 1995), pp. 2731–2737.

Elers, et al., "NbC15 as a precursor in atomic layer epitaxy", Appl. Surf. Sci., vol. 82/83 (1994), pp. 468–474.

Lee, "The Preparation of Titanium–Based Thin Film by CVD Using Titanium Chlorides as precursors", Chemical Vapor Deposition, 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/H2 Process", J. Electrochem. Soc., 145(8) (Aug. 1998), pp. 2926–2931.

Min, et al.,"Chemical Vapor Deposition of Ti–Si–N Films with Alternating Source Supply", Mat., Res. Soc. Symp. Proc., vol. 564 (Apr. 5, 1999), pp. 207–210.

Bedair, "Atomic layer epitaxy deposition processes", J. Vac. Sci. Technol. 12(1) (Jan./Feb. 1994).

Yamaga, et al., "Atomic layer epitaxy of ZnS by a new gas supplying system in a low–pressure metalorganic vapor phase epitaxy", J. of Crystal Growth 117 (1992), pp. 152–155.

* cited by examiner

LID ASSEMBLY FOR A PROCESSING SYSTEM TO FACILITATE SEQUENTIAL DEPOSITION TECHNIQUES

RELATED APPLICATIONS

This application claims benefit of U.S. Provisional Application No. 60/305,970, filed Jul. 16, 2001, which is incorporated herein by reference in its entirety.

Additionally, this application is related to U.S. patent application Ser. No. 09/798,251, entitled "Lid Assembly for a Processing System to Facilitate Sequential Deposition Techniques" filed on Mar. 2, 2001, U.S. patent application Ser. No. 09/798,258, entitled "Processing Chamber and Method of Distributing Process Fluids Therein to Facilitate Sequential Deposition of Films" filed on Mar. 2, 2001, U.S. patent application Ser. No. 09/605,596, entitled "Bifurcated Deposition Process For Depositing Refractory Metal Layer Employing Atomic Layer Deposition And Chemical Vapor Deposition" filed on Jun. 28, 2000, and U.S. patent application Ser. No. 09/678,266, entitled "Methods and Apparatus For Depositing Refractory Metal Layers Employing Sequential Deposition Techniques To Form Nucleation Layers" filed on Oct. 3, 2000, all of which are incorporated herein by reference in their entireties.

BACKGROUND OF THE INVENTION

1. Field of the Invention

This invention relates to semiconductor processing. More particularly, this invention relates to a processing system and method of distributing fluid therein to facilitate sequential deposition of films on a substrate.

2. Description of the Related Art

The semiconductor processing industry continues to strive for larger production yields while increasing the uniformity of layers deposited on substrates having increasingly larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer. Chemical Vapor Deposition (CVD) is a common deposition process employed for depositing layers on a substrate. CVD is a flux-dependent deposition technique that requires precise control of the substrate temperature and precursors introduced into the processing chamber in order to produce a desired layer of uniform thickness. These requirements become more critical as substrate size increases, creating a need for more complexity in chamber design and fluid flow technique to maintain adequate uniformity.

A variant of CVD that demonstrates superior step coverage is a sequential deposition technique known as Atomic Layer Deposition (ALD). ALD has steps of chemisorption that deposit monolayers of reactive precursor molecules on a substrate surface. To that end, a pulse of a first reactive precursor is introduced into a processing chamber to deposit a first monolayer of molecules on a substrate disposed in the processing chamber. A pulse of a second reactive precursor is introduced into the processing chamber to form an additional monolayer of molecules adjacent to the first monolayer of molecules. In this manner, a layer is formed on a substrate by alternatingly pulsing an appropriate reactive precursor into a deposition chamber. Each injection of a reactive precursor is separated by an inert fluid purge to provide a new atomic layer additive to previous deposited layers to form a uniform layer on the substrate. The cycle is repeated to form the layer to a desired thickness. The control over the relatively small volume of gas utilized in each pulse is problematic. Pulse frequency is limited by the response times of valves and flow lag within the chamber's gas delivery system. The lag is at least partially due to the relative remote position of control valves to the process chamber. Consequently, ALD techniques result in a deposition rate that is much lower than typical CVD techniques.

A need exists, therefore, to reduce the time required to deposit films employing sequential deposition techniques.

SUMMARY OF THE INVENTION

Provided is a lid assembly for a semiconductor system, an exemplary embodiment of which includes a support having opposed first and second surfaces, with a valve coupled to the first surface. A baffle plate is mounted to the second surface. The valve is coupled to the support to direct a flow of fluid along a path in an original direction and at an injection velocity. The baffle plate is disposed in the path to disperse the flow of fluid in a plane extending transversely to the original direction. The proximity of the valve to the baffle plate allows enhanced rate and control of fluid disposed through the lid assembly.

In one aspect of the invention, one embodiment of a lid assembly for a semiconductor processing system includes a lid having a gas manifold coupled to a first surface and a baffle plate coupled to a second surface. The gas manifold includes a body having a first channel, a second channel and a third channel extending therethrough. The baffle plate includes a recess formed in a first side of the baffle plate and defining a plenum with a second surface of the lid. The plenum communicates with the first, second and third channels via a plurality of inlet channels disposed in the lid. The baffle plate has a center passage disposed therethrough which provides a singular passageway between the plenum and the second side of the baffle plate. Optionally, any combination of the lid, gas manifold or baffle plate may additionally include features for controlling the heat transfer therebetween.

In another aspect of the invention, a baffle plate for distributing gases into a semiconductor processing chamber is provided. In one embodiment, the baffle plate includes a plate having a first side and a second side. A recess is formed in the first side and defines a plenum adapted to receive gases prior to entering the processing chamber. A center passage is disposed through the plate concentrically and is concentric with the recess. The center passage provides a single passageway between the recess and the second side of the plate.

BRIEF DESCRIPTION OF THE DRAWINGS

A more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE INVENTION

Figure 1:
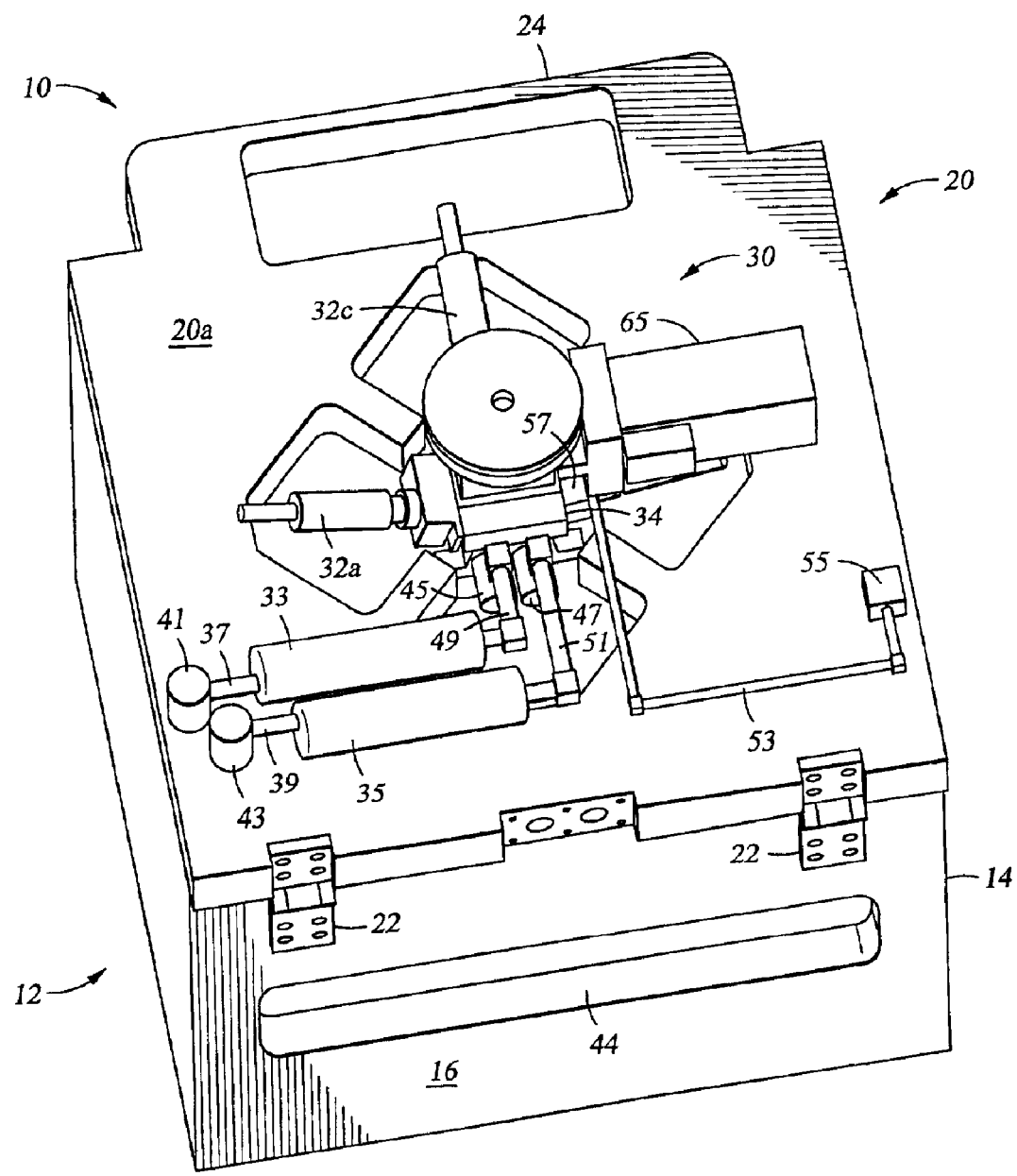
FIG. 1 is a simplified top perspective view of a plasma-based semiconductor processing system in accordance with one embodiment of the present invention.

Referring to FIG. 1, a semiconductor processing system 10 in accordance with one embodiment of the present invention includes an enclosure assembly 12 formed from a process-compatible material, such as aluminum or anodized aluminum. The enclosure assembly 12 includes a housing 14, defining a processing chamber 16 with an opening 44 selectively covered and a vacuum lid assembly 20. The vacuum lid assembly 20 is pivotally coupled to the housing 14 via hinges 22. A handle 24 is attached to the vacuum lid assembly 20 opposite the hinges 22. The handle 24 facilitates moving the vacuum lid assembly 20 between opened and closed positions. In the opened position, the interior of the chamber 16 is exposed. In the closed position shown in FIG. 1, the vacuum lid assembly 20 covers the chamber 16 forming a fluid-tight seal with the housing 14. In this manner, a vacuum formed in the processing chamber 16 is maintained as the vacuum lid assembly 20 seals against the housing 14.

To facilitate access to processing chamber 16 depicted in FIG. 1, without compromising the fluid-tight seal between vacuum lid assembly 20 and housing 14, a slit valve opening 44 is disposed in housing 14, as well as a vacuum lock door (not shown). Slit valve opening 44 allows transfer of a wafer (not shown) between processing chamber 16 and the exterior of system 10. Any conventional wafer transfer device (not shown) may achieve the aforementioned transfer. An example of a conventional wafer transfer device is described in commonly assigned U.S. Pat. No. 4,951,601, issued Aug. 20, 1990 to Maydan, the complete disclosure of which is incorporated herein by reference.

Figure 2:
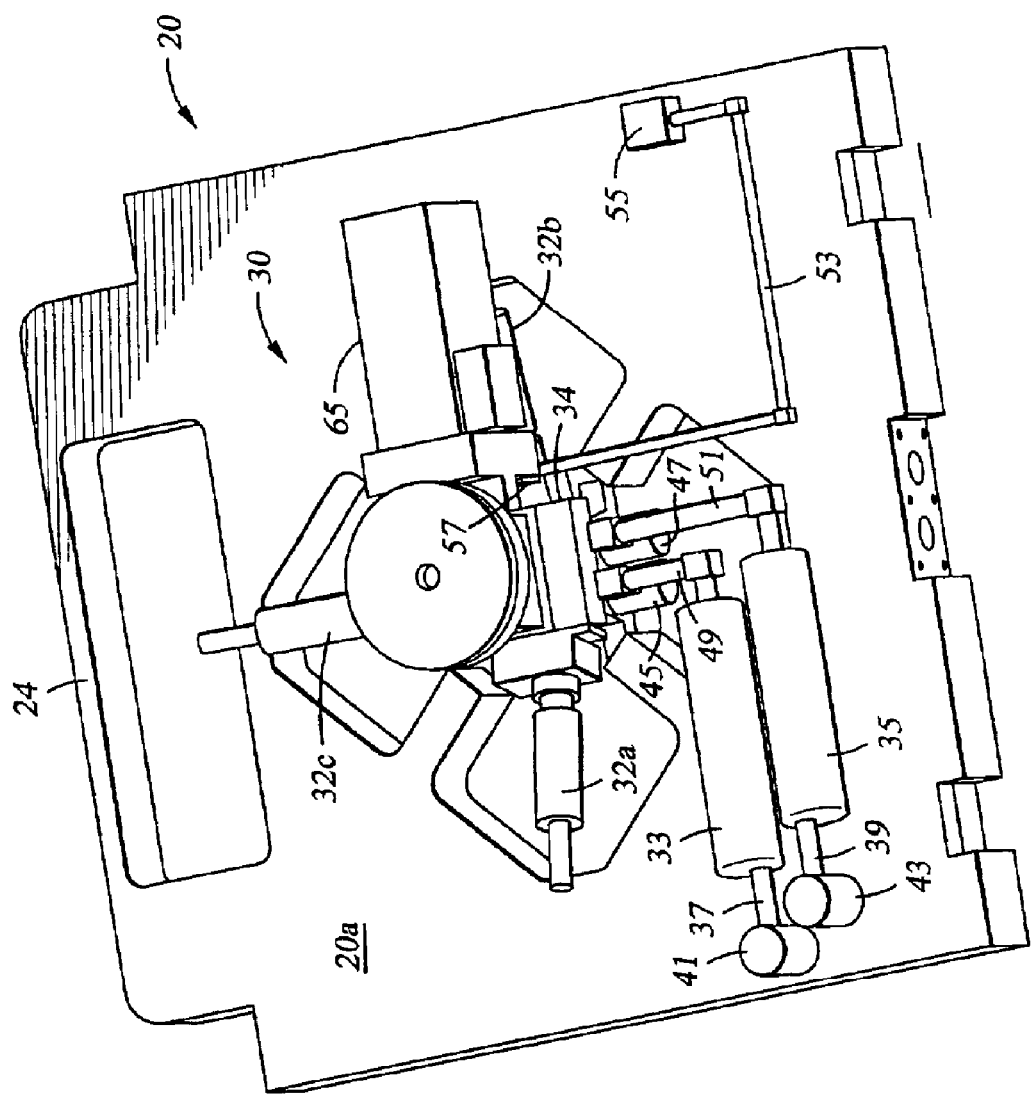
FIG. 2 is a top perspective view of one embodiment of a lid assembly of the invention.

FIG. 2 is a top perspective view of one embodiment of a vacuum lid assembly 20. The vacuum lid assembly 20 includes a lid 20a and a process fluid injection assembly 30 to deliver reactive, canier, purge, cleaning and/or other fluids into the processing chamber 16. Lid 20a includes opposing surfaces 21a and 21b. The fluid injection assembly 30 includes a gas manifold 34 mounting a plurality of control valves, 32a, 32b and 32c, and a baffle plate 36 (shown in FIG. 3). Valves 32a, 32b and 32c provide rapid and precise gas flow with valve open and close cycles of less than about one second, and in one embodiment, of less than about 0.1 second. In one embodiment, the valves 32a, 32b and 32c are surface mounted, electronically controlled valves. One valve that may be utilized is available from Fujikin of Japan as part number FR-21-6.35 UGF-APD. Other valves that operate at substantially the same speed and precision may also be used.

The lid assembly 20 further includes one or more, (two are shown in FIG. 1) gas reservoirs 33, 35 which are fluidically connected between one or more process gas sources and the gas manifold 34. The gas reservoirs 33, 35 provide bulk gas delivery proximate to each of the valves 32a, 32b, 32c. The reservoirs 33, 35 are sized to insure that an adequate gas volume is available proximate to the valves 32a, 32b, 32c during each cycle of the valves 32a, 32b and 32c during processing to minimize time required for fluid delivery thereby shortening sequential deposition cycles. For example, the reservoirs 33, 35 may be about 5 times the volume required in each gas delivery cycle.

Gas lines 37, 39 extend between connectors 41, 43 and the reservoirs 33, 35 respectively. The connectors 41, 43 are coupled to the lid 20a. The process gases are typically delivered through the housing 14 to the connectors 41, 43 before flowing into the reservoirs 33, 35 through the gas lines 37, 39.

Additional connectors 45, 47 are mounted adjacent the gas manifold 34 down stream from the reservoirs 33, 35 and connect to the reservoirs by gas lines 49, 51. The connectors 45, 47 and gas lines 49, 51 generally provide a flowpath for process gases from the reservoir 33, 35 to the gas manifold 34. A purge gas line 53 is similarly connected between a connector 55 and a connection 57 on the gas manifold 34. In one embodiment, a tungsten source gas, such as tungsten hexafluoride, is connected to the first reservoir 33 and a reducing gas such as silane or diborane is connected to the second reservoir 35.

Figure 3:
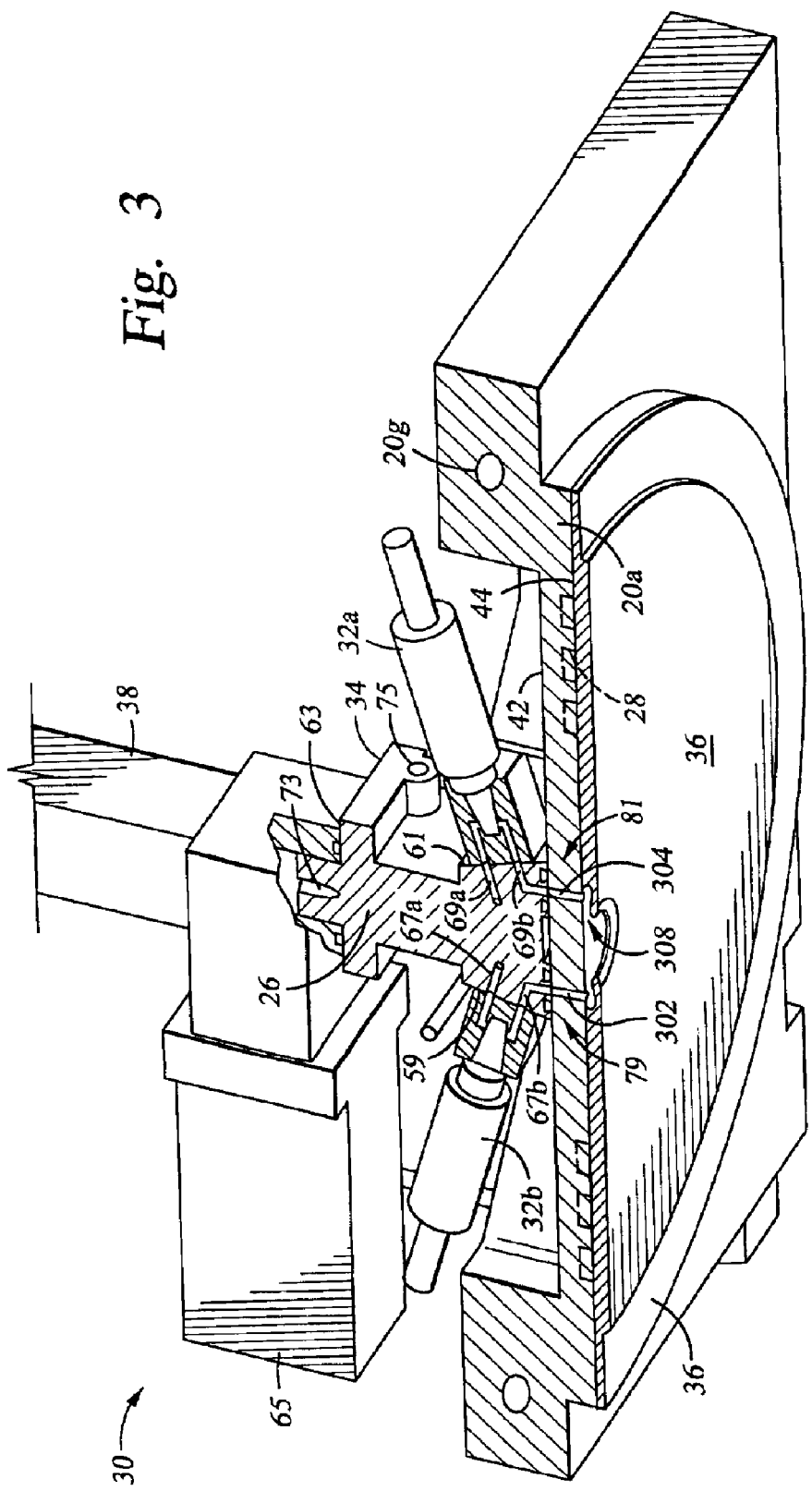
FIG. 3 is a sectional view of one embodiment of a lid assembly of the invention.
Figure 4:
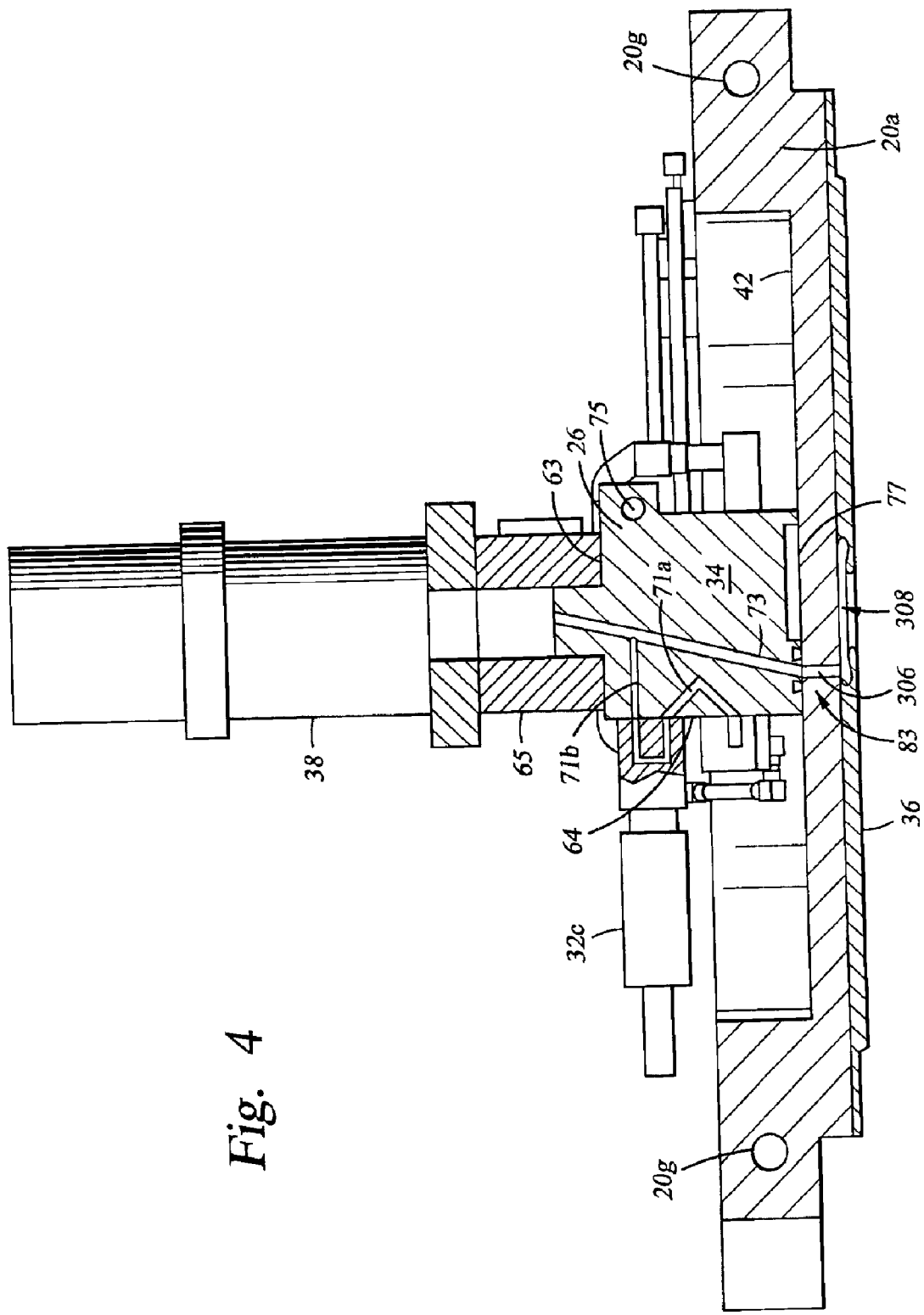
FIG. 4 is a sectional view of the embodiment of the lid assembly of FIG. 3.

FIGS. 3 and 4 are partial sectional views of the vacuum lid assembly 20. The gas manifold 34 includes a body defining three valve mounting surfaces 59, 61, 64 (mounting surface 64 is shown in FIG. 4) and an upper surface 63 for mounting an upper valve 65. The gas manifold 34 includes three pairs of gas channels 67a, 67b, 69a, 69b, 71a, 71b (71a and 71b are shown on FIG. 4) that fluidly couple the two process gases and a purge gas (shown as fluid sources 68a–c in FIG. 9) to the interior of the processing chamber 16 controllably through the valves 32a, 32b, 32c, thereby allowing thermal conditioning of the gases by the gas manifold 34 before reaching the valves 32a, 32b, 32c. Gas channels 67a, 69a, 71a (also termed thermal conditioning channels) are fluidly coupled to the connectors 45, 47, 57 and provide passage of gases through the gas manifold 34 to the valves 32a, 32b, 32c. Gas channels 67b, 69b and 71b deliver gases from the valves 32a, 32b, 32c through the gas manifold 34. The gas channel 71b delivers gas from the valve 32c through the gas manifold 34 and into a gas channel 73 passing through a member 26. The channels 67b, 69b and 73 are fluidly coupled to a respective inlet passage 302, 304 and 306 disposed through the lid 20a. Gases or other fluids flowing through the inlet passages 302, 304 and 306 flow into a plenum or region 308 defined between the lid 20a and baffle plate 36 before entering the chamber 16.

The channel 73 additionally is coupled to the upper surface 63. The valve 65 is disposed between the upper surface 63 of the gas manifold 34 and a cleaning source 38. The cleaning source 38 is a compact system for providing cleaning reagents, typically in the form of fluorine or fluorine radicals, for removing contaminants and deposition byproducts from the chamber 16. In one embodiment, the cleaning source 38 is a remote plasma source that typically includes subsystems (not shown) such as a microwave generator in electrical communication with a plasma applicator, an autotuner and an isolator. The gas channel 73 through which the cleaning gases are delivered from the cleaning source 38 is additionally connected with the gas channel 71b that delivers purge gas to the chamber 16 through the plenum 308 disposed in the baffle plate 36. In this manner, as purge gas is delivered to the chamber 16, any cleaning reagents remaining in the channel 73 between the gas channel 71b and the chamber 16 may be flushed and exhausted from the chamber 16 prior to the next deposition process.

The gas manifold 34 further includes a conduit 75 for flowing a heat transfer medium therethrough, thus allowing temperature control of the gas manifold 34. In tungsten deposition processes, for example, the gas manifold 34 is typically cooled. For other processes, such as titanium nitride deposition, the gas manifold 34 may be heated to prevent condensation of the reactive gases within the manifold. To further assist in temperature control of the gas manifold 34, a lower surface 77 of the gas manifold 34 may be configured to tailor the surface area contact with a first surface 42 of the lid 20a, thus controlling the thermal transfer between the housing 14 and manifold through the lid 20a. Alternatively, the housing 14 and manifold 34 may be configured to maximize the contact area.

Optionally, a plurality of recesses 28 may be formed in a second surface 44 of the lid 20a that contacts the baffle plate 36. The recesses 28 allow the contact area between the baffle plate 36 and lid 20a to be tailored to promote a desired rate of heat transfer. The baffle plate 36 may alternately be configured to control the contact area with the lid 20a as described with reference to FIGS. 6 and 7 below.

Figure 5B:
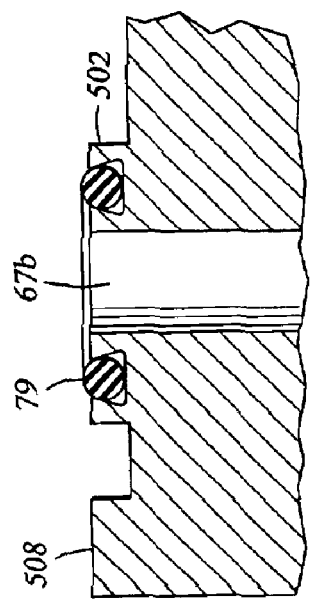
FIG. 5B depicts a partial sectional view of the gas manifold taken along section line 5B—5B of FIG. 5A.
Figure 5A:
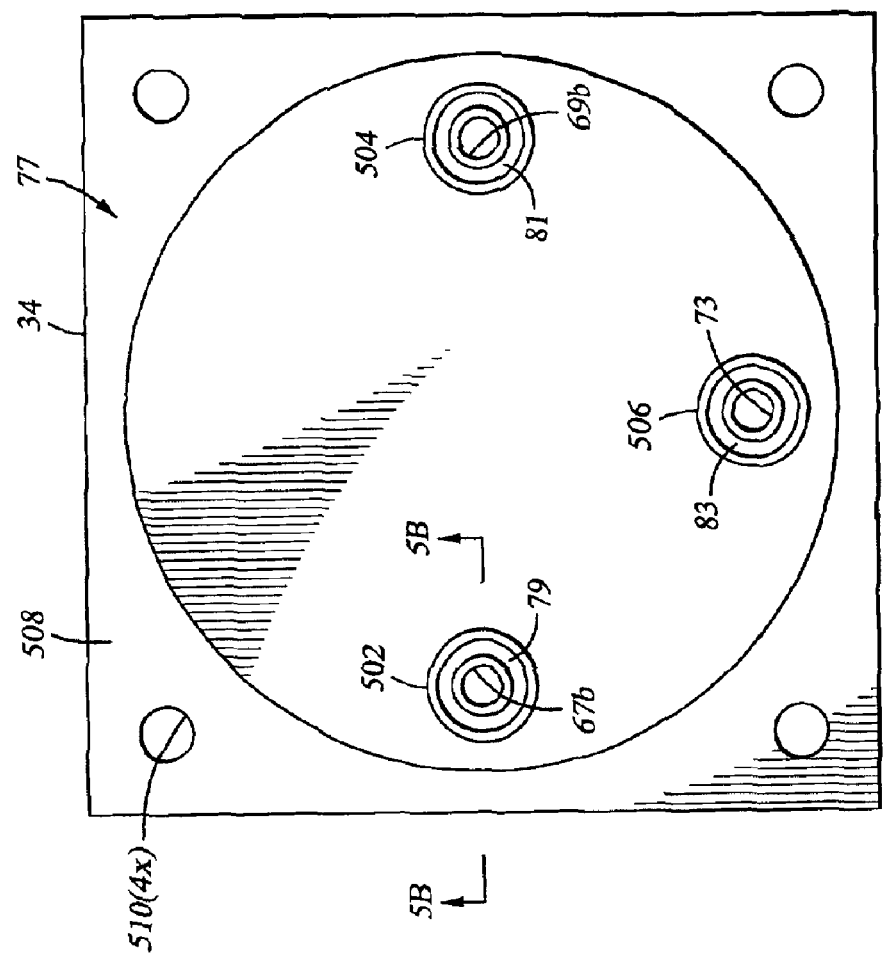
FIG. 5A depicts a bottom view of one embodiment of a gas manifold.

Referring to FIGS. 5A and 5B, the lower surface 77 of the gas manifold 34 is illustrated configured to minimize surface area contact with the lid 20a. Each of the three gas channels 67b, 69b, 73 pass respectively through bosses 502, 504 and 506 that project from the gas manifold 34. Each boss 502, 504 and 506 has an o-ring chase 79, 81, 83 that respectively surrounds each gas channel 67b, 69b, 73 to prevent fluids passing therethrough from leaking between the gas manifold 34 and the lid 20a. A mounting surface 508 surrounds the bosses 502, 504 and 506 and includes a plurality of mounting holes 510 which facilitate coupling the gas manifold 34 to the cover 20a. In one embodiment, the gas manifold 34 is fastened by screws threading into blind holes formed in the lid 20a (screws and blind holes not shown). As the bosses 502, 504 and 506 and mounting surface 508 provide a controlled contact area between the gas manifold 34 and the cover 20a, the thermal transfer therebetween can be minimized. The contact area between the gas manifold 34 and the cover 20a may utilize other geometries to tailor the heat transfer therebetween. For example, the lower surface 77 of the gas manifold 34 can be planar to provide maximum contact area with the lid 20a and thus maximize heat transfer between the lid 20a and the gas manifold 34.

Returning to FIG. 4, temperature control of system 10 may be achieved by flowing a heat transfer medium through a temperature control channel 20g disposed within the lid 20a. The temperature control channel 20g is in fluid communication with heat transfer medium supply (not shown) that provides and/or regulates the temperature of the heat transfer medium flowing through the channel 20g to control (i.e., heat, cool or maintain constant) the temperature of the lid 20a.

Figure 6:
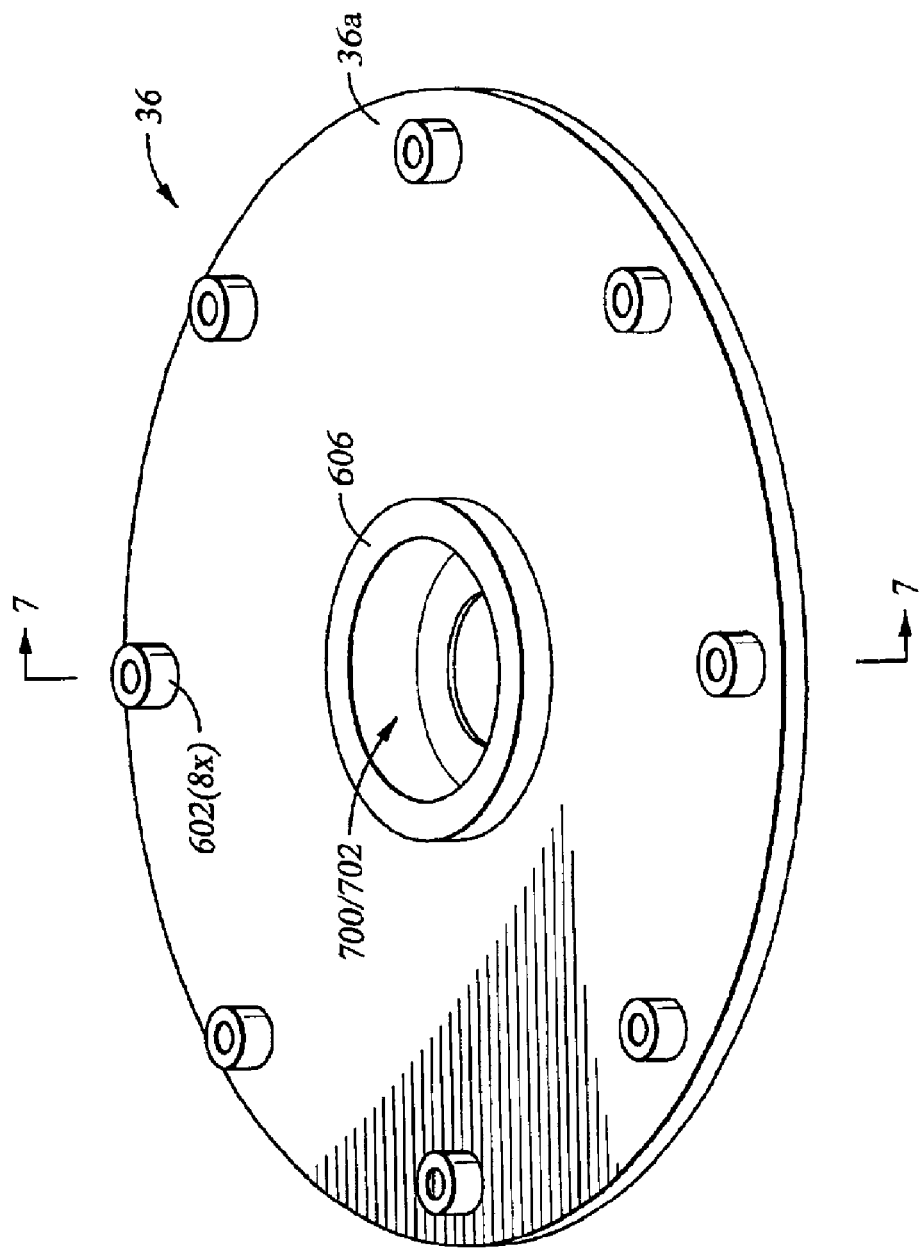
FIG. 6 is a perspective view of one embodiment of a baffle plate.
Figure 7:
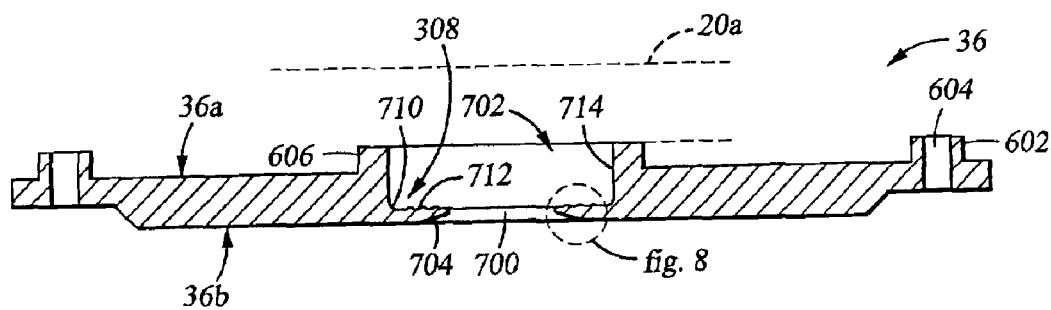
FIG. 7 is a sectional view of the baffle plate taken along section line 7—7 of FIG. 6.

FIGS. 6 and 7 depict one embodiment of the baffle plate 36. The baffle plate 36 is coupled to the lid 20a opposite the gas manifold 34. The baffle plate 36 is generally comprised of a process compatible material such as aluminum and is utilized to mix and uniformly distribute gases entering the chamber 16 from the gas manifold 34. The baffle plate 36 may be removed from the lid 20a for cleaning and/or replacement. Alternatively, the baffle plate 36 and lid 20a may be fabricated as a single member.

The baffle plate 36 is generally annular and includes a first side 36a disposed proximate the lid 20a and a second side 36b generally exposed to interior of the processing chamber 16. The baffle plate 36 has a passage 700 disposed between the first side 36a and the second side 36b. A recess 702, typically concentric with the passage 700, extends into the first side 36a. The recess 702 and lid 20a define a plenum 716 therebetween. The recess 702, typically circular in form, is configured to extend radially from a center line of the baffle plate 36 to a diameter that extends beyond the inlet passages 302, 304, 306 disposed in the lid 20a so that gases flowing from the inlet passages enters the plenum 716 and exits through the passage 700.

A bottom 712 of the recess 702 defines a mixing lip 704 that extends radially inward into the passage 700. The transition from a wall 714 of the recess 702 to the bottom 712 includes a radius 710 to assist in directing fluid flow within the recess 702 while maximizing the swept volume of the recess 702. Gases flowing into the plenum 716 from the inlet passages 302, 304, 306 are re-directed by the flat surface of the mixing lip 704 generally towards the center of the recess 702 before passing through the passage 700 and into the process chamber 16. The recess 702 combined with a singular exit passage for delivering gases to the chamber 16 (e.g., the passage 700) advantageously reduces the surface area and orifices requiring purging and cleaning over conventional showerheads having multiple orifices for gas delivery.

Figure 8:
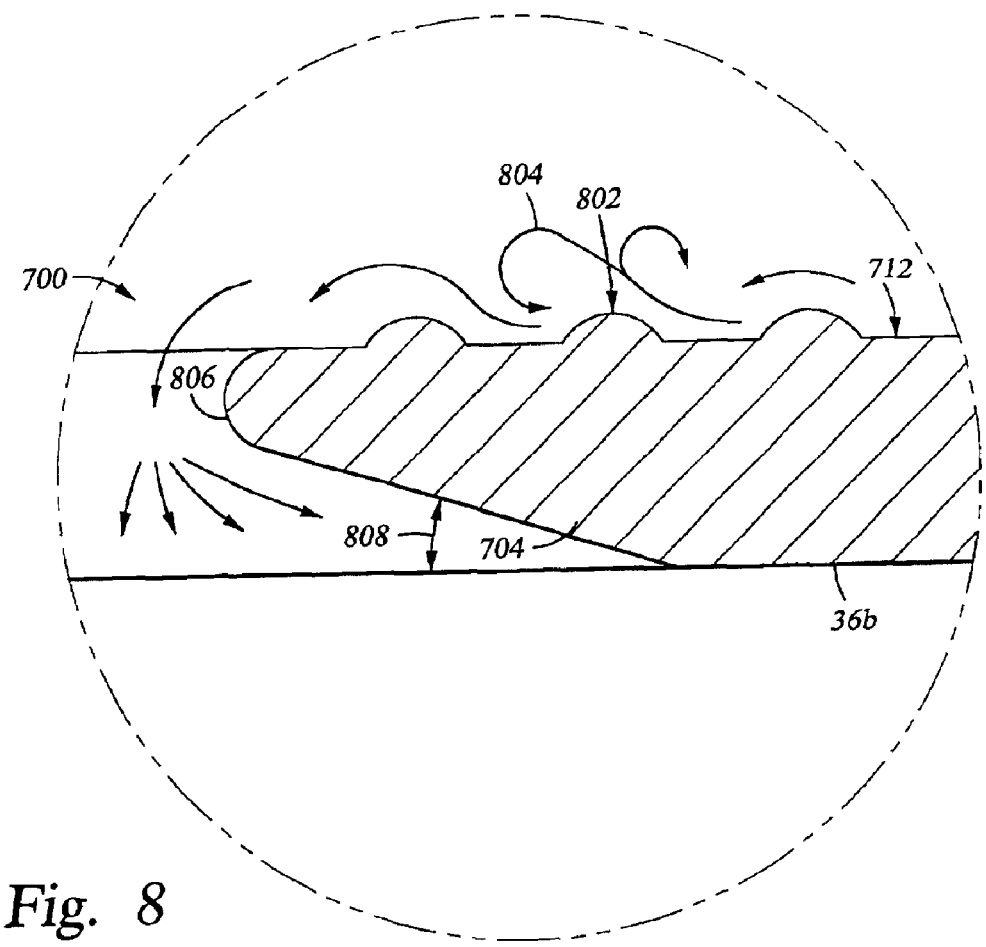
FIG. 8 is a partial sectional view of one embodiment of a mixing lip.

FIG. 8 depicts a partial sectional view of one embodiment of the mixing lip 704. The mixing lip 704 may include an optional sculptured surface 802 that directs the gas flows towards one another or induces turbulence to enhance mixing and/or cleaning. The sculptured surface 802 may includes any one or combination of turbulence-inducing features such as one or more bumps, grooves, projections, indentations, embossed patterns and the like. Alternatively, bottom 712 of the recess 702 defining the mixing lip 704 may be smooth. In one embodiment, the mixing lip 704 directs gases moving substantially axially from the lid 20a transversely towards the center of the passage 700 in either a turbulent flow as depicted by flow lines 804, laminar flow or combination thereof, where the converging gas flows mix before exiting the passage 700.

The mixing lip 704 may include a rounded tip 806 to assist in directing the flow through the passage 700 and into the chamber 16 with minimal pressure drop. In one embodiment, the mixing lip 704 includes a transition angle 808 between the tip 804 and the second side 36b of the baffle plate 36 to enhance the radial flow and uniformity of fluids exiting the passage 700 and into the chamber 16.

Returning to FIGS. 6 and 7, the first side 36a of the baffle plate 36 may additionally include features for reducing the contact area between the baffle plate 36 and the lid 20a. Providing reduced contact area allows the baffle plate 36 to be operated at a higher temperature than the lid 20a, which in some processes enhances deposition performance. In the embodiment depicted in FIG. 7, the first side 36a of the baffle plate 36 includes a plurality of bosses 602, each having a mounting hole 604 passing therethrough. The bosses 602 allow the baffle plate 36 to be coupled to the lid 20a by fasteners passing through the mounting holes 604 into blind threaded holes formed in the lid 20a (fasteners and threaded holes not shown). Additionally, a ring 606 projects from the first side 36a and circumscribes the recess 702. The ring 606 and bosses 602 project to a common elevation that allows the baffle plate 36 to be coupled to the lid 20a in a spaced-apart relation. The spaced-apart relation and the controlled contact area permit controlled thermal transfer between the baffle plate 36 and the lid 20a. Accordingly, the contact area provided by bosses 602 and the ring 606 may be designed to tailor the amount and location of the solid to solid contact area available for thermal transfer between the baffle plate 36 and the lid 20a as a particular deposition process requires.

Figure 9:
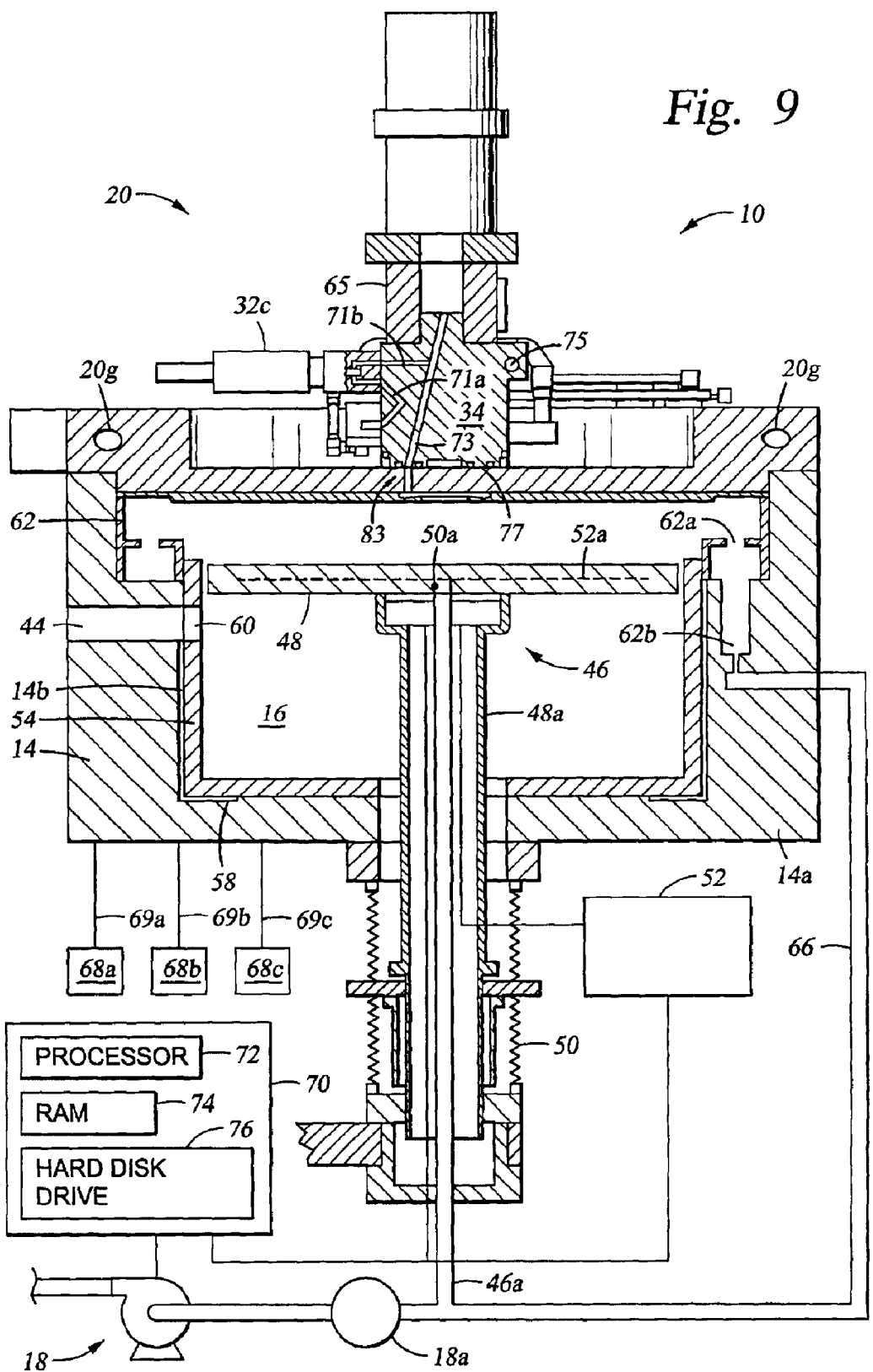
FIG. 9 is a cross-sectional view of the processing chamber of FIG. 1 connected to various subsystems associated with system.
Figure 2:
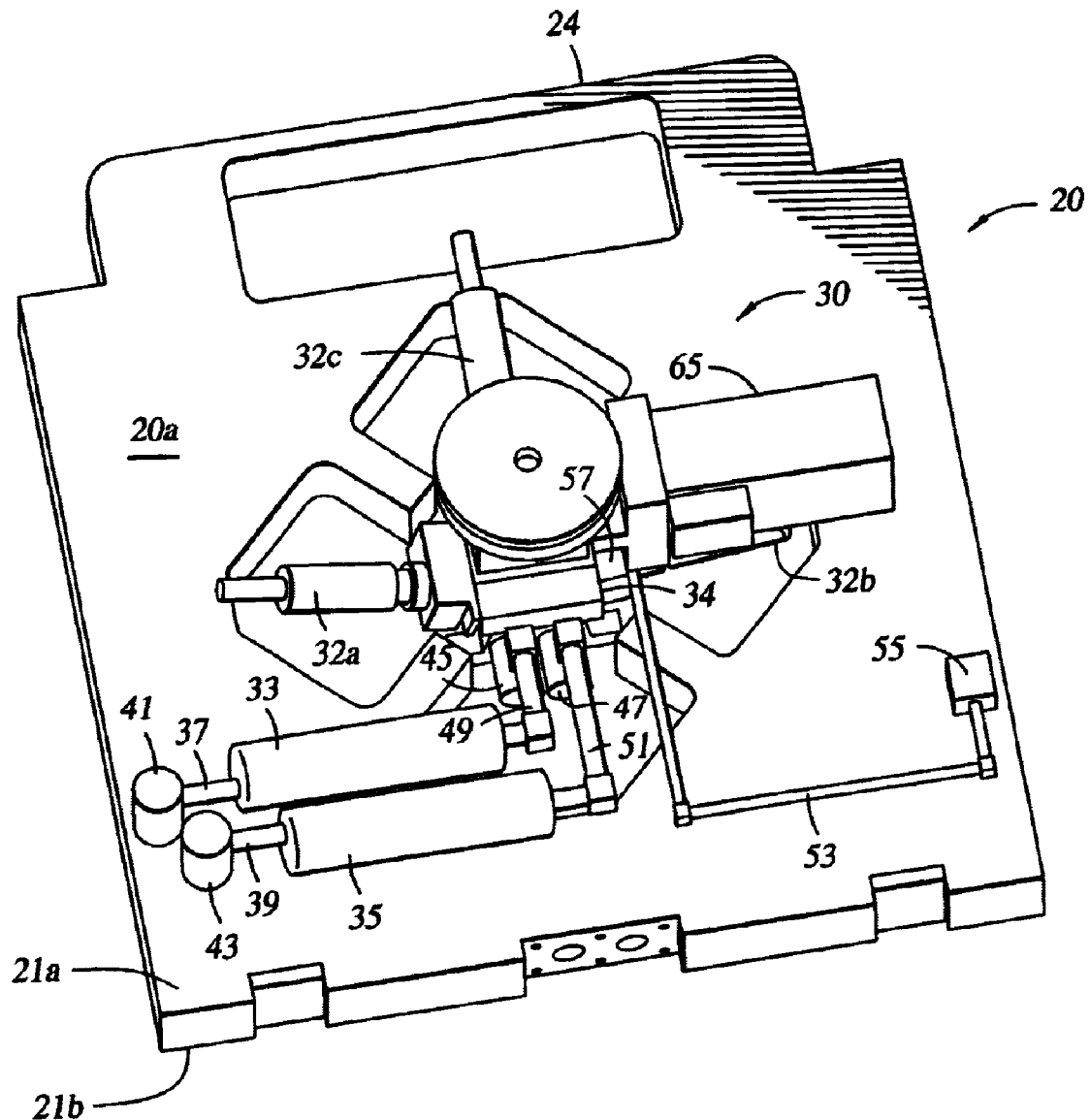
Figure 3:
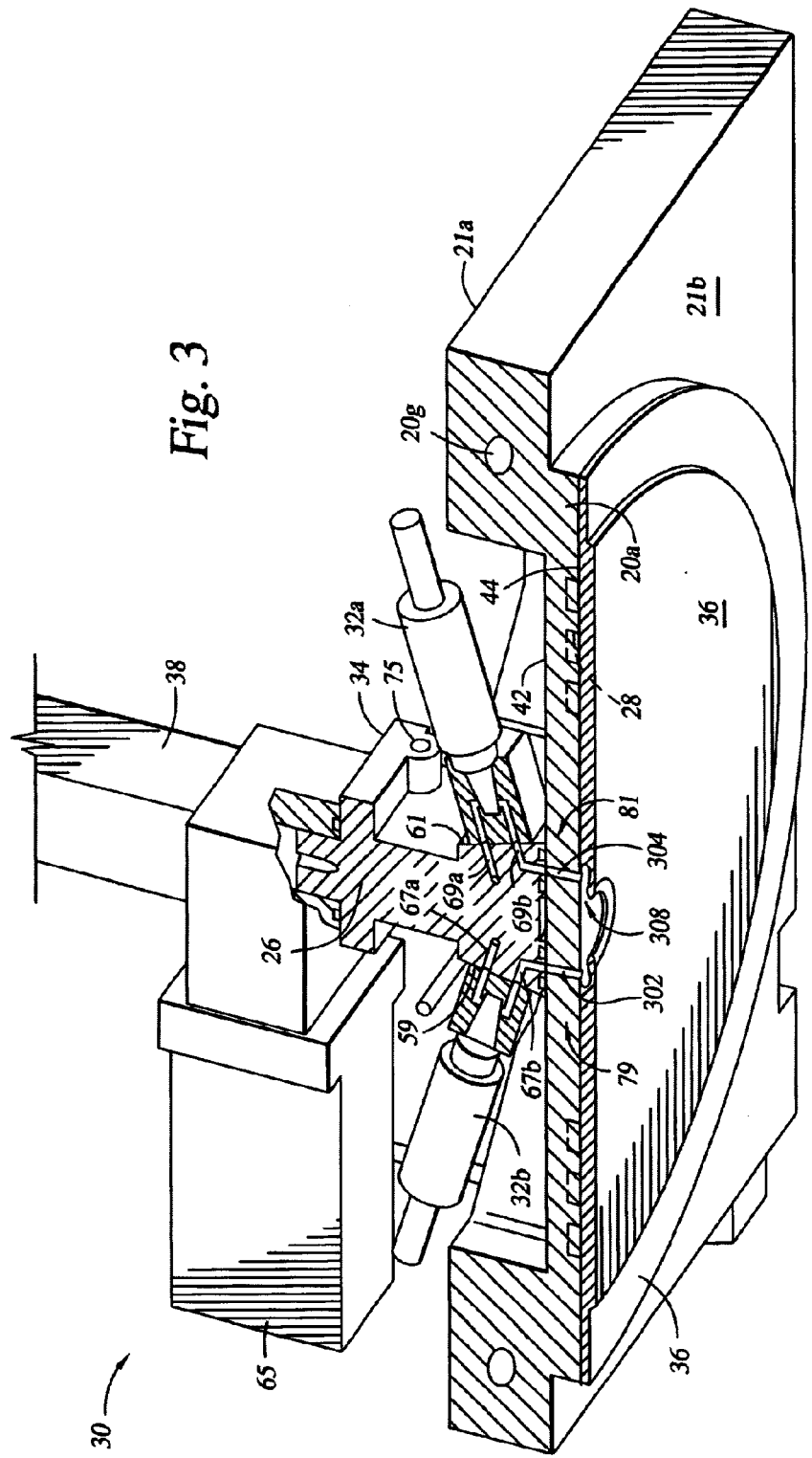

Referring to FIG. 9, disposed within processing chamber 16 is a heater/lift assembly 46 that includes a wafer support pedestal 48 connected to a support shaft 48a. The support pedestal 48 is positioned between the shaft 48a and the vacuum lid assembly 20 when the vacuum lid assembly 20 is in the closed position. The support shaft 48a extends from the wafer support pedestal 48 away from vacuum lid assembly 20 through a passage formed in the housing 14. A bellows 50 is attached to a portion of the housing 14 disposed opposite to the lid assembly 20 to prevent leakage into the chamber 16 from between the support shaft 48a and housing 14. The heater/lift assembly 46 may be moved vertically within the chamber 16 so that a distance between support pedestal 48 and vacuum lid assembly 20 may be controlled. A sensor (not shown) provides information concerning the position of support pedestal 48 within processing chamber 16. An example of a lifting mechanism for the support pedestal 48 is described in detail in U.S. Pat. No. 5,951,776, issued Sep. 14, 1999 to Selyutin et al., entitled "Self-Aligning Lift Mechanism", which is hereby incorporated by reference in it entirety.

The support pedestal 48 includes an embedded thermocouple 50a that may used to monitor the temperature thereof. For example, a signal from the thermocouple 50a may be used in a feedback loop to control power applied to a heater element 52a by a power source 52. The heater element 52a may be a resistive heater element or other thermal transfer device disposed in or in contact with the pedestal 48 utilized to control the temperature thereof. Optionally, support pedestal 48 may be heated using a heat transfer fluid (not shown).

The support pedestal 48 may be formed from any process-compatible material, including aluminum nitride and aluminum oxide ($Al_2O_3$ or alumina) and may also be configured to hold a substrate thereon employing a vacuum, i.e. support pedestal 48 may be a vacuum chuck. To that end, support pedestal 48 may include a plurality of vacuum holes (not shown) that are placed in fluid communication with a vacuum source, such as pump system via vacuum tube routed through the support shaft 48a.

A liner assembly is disposed in the processing chamber 16 and includes a cylindrical portion 54 and a planar portion 56. The cylindrical portion 54 and the planar portion 56 may be formed from any suitable material such as aluminum, ceramic and the like. The cylindrical portion 54 surrounds the support pedestal 48. The cylindrical portion 54 additionally includes an aperture 60 that aligns with the slit valve opening 44 disposed a side wall 14b of the housing 14 to allow entry and egress of substrates from the chamber 16.

The planar portion 56 extends transversely to the cylindrical portion 54 and is disposed against a chamber bottom 14a of processing chamber 16 disposed opposite to lid assembly 20. The liner assembly defines a chamber channel 58 between the housing 14 and both cylindrical portion 54 and planar portion 56. Specifically, a first portion of channel 58 is defined between the chamber bottom 14a and planar portion 56. A second portion of channel 58 is defined between the side wall 14b of the housing 14 and the cylindrical portion 54. A purge gas is introduced into the channel 58 to minimize inadvertent deposition on the chamber walls along with controlling the rate of heat transfer between the chamber walls and the liner assembly.

Disposed along the side walls 14b of the chamber 16 proximate the lid assembly 20 is a pumping channel 62. The pumping channel 62 includes a plurality of apertures, one of which is shown as a first aperture 62a. The pumping channel 62 includes a second aperture 62b that is coupled to a pump system 18 by a conduit 66. A throttle valve 18A is coupled between the pumping channel 62 and the pump system 18. The pumping channel 62, throttle valve 18A and pump system 18 control the amount of flow from the processing chamber 16. The size and number and position of apertures 62a in communication with the chamber 16 are configured to achieve uniform flow of gases exiting the lid assembly 20 over support pedestal 48 and substrate seated thereon. A plurality of supplies 68a, 68b and 68c of process and/or other fluids, are in fluid communication with one of valves 32a, 32b or 32c through a sequence of conduits (not shown) formed through the housing 14, lid assembly 20, and gas manifold 34.

A controller 70 regulates the operations of the various components of system 10. The controller 70 includes a processor 72 in data communication with memory, such as random access memory 74 and a hard disk drive 76 and is in communication with at least the pump system 18, the power source 52, and valves 32a, 32b and 32c.

Although any type of process fluid may be employed, one example of process fluids are $B_2H_6$ gas and $WF_6$ gas, and a purge fluid is Ar gas. $N_2$ may also be used as a purge gas. The chamber pressure is in the range of 1–5 Torr, and the pedestal 48 is heated in the range of 350° to 400° C. Each of the process fluids is flowed into the processing chamber 16 with a carrier fluid, such as Ar. It should be understood, however, that the purge fluid might differ from the carrier fluid, discussed more fully below.

One cycle of the sequential deposition technique in accordance with the present invention includes flowing the purge fluid, Ar, into the processing chamber 16 during time $t_1$, before $B_2H_6$ is flowed into the processing chamber 16. During time $t_2$, the process fluid $B_2H_6$ is flowed into the processing chamber 16 along with a carrier fluid, which in this example is Ar. After the flow of $B_2H_6$ terminates, the flow of Ar continues during time $t_3$, purging the processing chamber 16 of $B_2H_6$. During time $t_4$, the processing chamber 16 is pumped so as to remove all process fluids. After pumping of the processing chamber 16, the carrier fluid Ar is introduced during time $t_5$, after which time the process fluid $WF_6$ is introduced into the processing chamber 16, along with the carrier fluid Ar during time $t_6$. After the flow of $WF_6$ into the processing chamber 16 terminates, the flow of Ar continues during time $t_7$. Thereafter, the processing chamber 16 is pumped so as to remove all process fluids therein, during time $t_8$, thereby concluding one cycle of the sequential deposition technique in accordance with the present invention. This sequence of cycles is repeated until the layer being formed thereby has desired characteristics, such as thickness, conductivity and the like. It can be seen that the time required during each period $t_1$–$t_7$ greatly affects the throughput of system 10. To maximize the throughput, the lid assembly 20 and the injection assembly 30 are configured to minimize the time required to inject process fluids into the processing chamber 16 and disperse the fluids over the process region proximate to the support pedestal 48. For example, the proximity of the reservoirs 33, 35 and valves 32a–b to the gas manifold 34 reduce the response times of fluid delivery, thereby enhancing the frequency of pulses utilized in ALD deposition processes. Additionally, as the purge gases are strategically delivered through the lower portion of the passage 73, sweeping of cleaning agents from the gas manifold 34 and baffle plate 36 is ensured and process uniformity with smaller process gas volumes is enhanced.

Although the invention has been described in terms of specific embodiments, one skilled in the art will recognize that various modifications may be made that are within the scope of the present invention. For example, although three valves are shown, any number of valves may be provided, depending upon the number of differing process fluids employed to deposit a film. Therefore, the scope of the invention should not be based upon the foregoing description. Rather, the scope of the invention should be determined based upon the claims recited herein, including the full scope of equivalents thereof.

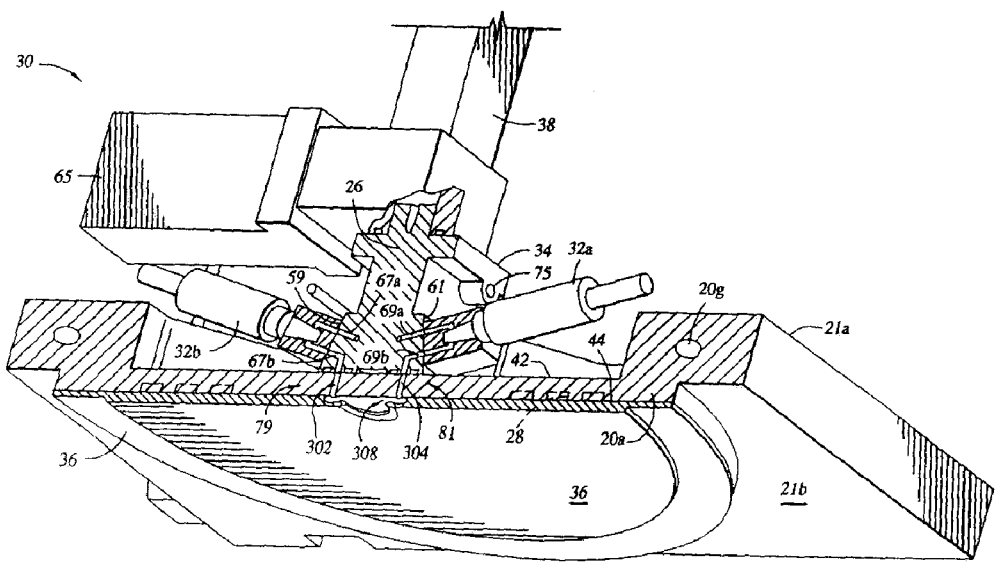

What is claimed is:

1. A lid assembly for a semiconductor processing system, the lid assembly comprising:
    a lid having first and second opposed surfaces;
    a plurality of controllable flow channels extending from the first and second opposed surfaces; and
    a gas control system disposed on the first surface and operably opening and closing the channels, wherein the gas control system comprises:
    a gas manifold disposed on the lid;
    at least one valve coupled to the gas manifold and adapted to control a flow through one of the flow channels; and
    a reservoir positioned on the lid and fluidly connected to the gas manifold.

2. The lid assembly of claim 1, wherein the gas manifold comprises:
    an upper surface and a lower surface;
    a first channel, a second channel and a third channel each extending through the gas manifold and exiting the lower surface; and
    a fourth channel extending from the upper surface and coupling to the third channel.

3. The lid assembly of claim 2, wherein the gas manifold further comprises:
    a conduit disposed therein adapted to flow a heat transfer fluid therethrough.

4. The lid assembly of claim 2, wherein the gas control system further comprises: a remote plasma source fluidly coupled to the fourth channel.

5. A lid assembly for a semiconductor processing system, the lid assembly comprising:
    a lid having first and second opposed surfaces, the first and second opposed surfaces having a first inlet channel, a second inlet channel and a third inlet channel disposed therethrough;
    a gas manifold coupled to the first surface of the lid, the gas manifold comprising:
    a body having an upper surface and lower surface;
    a first channel, a second channel, and a third channel each extending through the gas manifold to the lower surface;
    a valve coupled to the gas manifold; and
    a gas reservoir positioned on the lid and fluidly connected to the gas manifold.

6. The lid assembly of claim 5, wherein the gas manifold further comprises a fourth channel coupled between the upper surface and the third channel.

7. The lid assembly of claim 6 further comprising:
    a remote plasma source fluidly coupled to the fourth channel.

8. The lid assembly of claim 5 further comprising:
    a thermal conditioning channel disposed in the gas manifold fluidly coupling the valve and the gas reservoir.

9. A lid assembly for a semiconductor processing system, the lid assembly comprising:
    a lid having first and second opposed surfaces, the first and second opposed surfaces having a plurality of inlet channels disposed therethrough;
    a valve;
    a gas manifold coupled to the first surface of the lid, the gas manifold comprising:
    a body having an upper surface and lower surface;
    a plurality of gas channels extending through the gas manifold to the lower surface; and
    a thermal conditioning channel disposed in the gas manifold and fluidly coupled to at least one of the plurality of gas channels by the valve; and
    a gas reservoir fluidly positioned on the lid, connected to the gas manifold, and fluidly coupled to the valve by the thermal conditioning channel.

10. The lid assembly of claim 9, wherein the gas manifold further comprises a cleaning agent supply channel coupled between the upper surface and one of the plurality of channels.

11. The lid assembly of claim 10 further comprising:
    a cleaning source fluidly coupled to the cleaning agent supply channel.

12. The lid assembly of claim 9 further comprising:
    a baffle plate having a first side and a second side, the first side coupled to the second surface of the lid and having a recess formed therein, the recess defining a plenum with the second surface of the lid and fluidly communicating with the plurality of channels via the inlet channels disposed in the lid, the baffle plate having a center passage disposed therethrough providing a singular passageway between the plenum and the second side of the baffle plate.

13. The lid assembly of claim 12, wherein the second surface of the lid further comprises a plurality of recesses formed therein that reduce the contact area with the first side of the baffle plate.

14. The lid assembly of claim 12, wherein the first side of the baffle plate further comprises a plurality of bosses that maintain the first side of the baffle plate in a spaced-apart relation with the second surface of the lid.

15. The lid assembly of claim 14, wherein at least one of the bosses has a mounting hole disposed therethrough.

16. The lid assembly of claim 12, wherein the first side of the baffle plate further comprises a ring circumscribing the recess that maintains the first side of the baffle plate in a spaced-apart relation with the second surface of the lid.

17. The lid assembly of claim 12, wherein the first side of the baffle plate further comprises a ring circumscribing the recess and a plurality of bosses disposed radially outward of the ring, the ring and bosses maintaining the first side of the baffle plate in a spaced-apart relation with the second surface of the lid.

18. The lid assembly of claim 17, wherein the ring and bosses extend from the first side of the baffle plate to a common elevation.

19. A lid assembly for a semiconductor processing system, comprising:

a lid having a first surface opposed to a second surface;

at least one controllable flow channel extending from the first surface through the second surface; and a gas control system disposed on the first surface and operably opening and closing the at least one controllable flow channel, wherein the gas control system comprises:

a gas manifold disposed on the lid;

at least one valve coupled to the gas manifold adapted to control a flow through the at least one controllable flow channel; and at least one precursor reservoir fluidly connected between at least one precursor source and the gas manifold.

20. The lid assembly of claim 19, wherein a remote plasma source is fluidly coupled to the at least one controllable flow channel.

21. A lid assembly for a semiconductor processing system, comprising:

a lid having a first surface opposed to a second surface; and a gas control system disposed on the first surface and operably opening and closing at least one controllable flow channel, wherein the gas control system comprises:

a gas manifold disposed on the lid;

at least one valve coupled to the gas manifold and adapted to control a flow through the at least one controllable flow channel;

at least one precursor reservoir fluidly connected to the gas manifold; and at least one precursor source fluidly connected to the at least one precursor reservoir.

22. The lid assembly of claim 21, wherein the at least one controllable flow channel extends from the first surface through the second surface.

23. The lid assembly of claim 21, wherein a remote plasma source is fluidly coupled to the at least one controllable flow channel.

* * * * *

UNITED STATES PATENT AND TRADEMARK OFFICE
CERTIFICATE OF CORRECTION

PATENT NO. : 6,878,206 B2
APPLICATION NO. : 10/016300
DATED : April 12, 2005
INVENTOR(S) : Tzu et al.

It is certified that error appears in the above-identified patent and that said Letters Patent is hereby corrected as shown below:

Title page should be deleted and substitute therefore the attached title page.

Drawings:

Delete drawing sheets 1-2, and substitute therefore the drawing sheets, consisting of Figs. 1-2, as shown on the attached pages.

Col. 5, line 59, insert a space (" ") after "20g."

Signed and Sealed this

Seventeenth Day of October, 2006

JON W. DUDAS
*Director of the United States Patent and Trademark Office*

(12) United States Patent
Tzu et al.

(10) Patent No.: US 6,878,206 B2
(45) Date of Patent: Apr. 12, 2005

(54) LID ASSEMBLY FOR A PROCESSING SYSTEM TO FACILITATE SEQUENTIAL DEPOSITION TECHNIQUES

(75) Inventors: Gwo-Chuan Tzu, Sunnyvale, CA (US); Salvador P. Umotoy, Antioch, CA (US)

(73) Assignee: Applied Materials, Inc., Santa Clara, CA (US)

(*) Notice: Subject to any disclaimer, the term of this patent is extended or adjusted under 35 U.S.C. 154(b) by 145 days.

(21) Appl. No.: 10/016,300

(22) Filed: Dec. 12, 2001

(65) Prior Publication Data

US 2003/0010451 A1 Jan. 16, 2003

Related U.S. Application Data

(60) Provisional application No. 60/305,970, filed on Jul. 16, 2001.

(51) Int. Cl.$^7$ .................................................. C23C 16/00
(52) U.S. Cl. .................... 118/715; 118/728; 156/345.29; 156/345.33
(58) Field of Search ........................ 118/715, 728, 118/50; 156/345.29, 345.33, 345.34, 345.35, 345.36, 345.26, 345.51; 137/262, 263, 264, 454.2, 560, 561 R, 561 A, 571, 572, 573, 574, 575, 576, 590, 594–596, 599.01, 599.05–599.07, 602; 141/285, 286, 37, 44–47, 54, 301–302, 367

(56) References Cited

U.S. PATENT DOCUMENTS

| | | | |
|---|---|---|---|
| 3,592,575 A | * 7/1971 | Jaeger et al. | 431/114 |
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,761,269 A | * 8/1988 | Conger et al. | 118/679 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,625 A | 8/1989 | Nishizawa et al. | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |
| 4,927,670 A | 5/1990 | Erbil | 427/255.3 |
| 4,931,132 A | 6/1990 | Aspnes et al. | 156/601 |

(Continued)

FOREIGN PATENT DOCUMENTS

| | | | |
|---|---|---|---|
| DE | 196 27 017 A1 | 1/1997 | H01L/21/283 |
| DE | 198 20 147 A1 | 7/1999 | H01L/21/3205 |
| EP | 0 344 352 A1 | 6/1988 | H01J/39/24 |

(Continued)

OTHER PUBLICATIONS

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

(Continued)

*Primary Examiner*—Rudy Zervigon
(74) *Attorney, Agent, or Firm*—Moser Patterson Sheridan

(57) ABSTRACT

A lid assembly for a semiconductor processing system is provided. The lid assembly generally includes a lid having a gas manifold mounted on a first side and a baffle plate mounted on a second side. The gas manifold is configured to deliver a plurality of gases to a plenum defined between the baffle plate and the lid. The gases are mixed within a recess formed in the baffle plate before exiting into the processing system through a singular passage.

23 Claims, 8 Drawing Sheets